(12) United States Patent
Nakashima et al.

(10) Patent No.: US 8,587,251 B2
(45) Date of Patent: Nov. 19, 2013

(54) SWITCHING CIRCUIT, CONTROL APPARATUS, AND POWER GENERATION SYSTEM

(75) Inventors: Takeshi Nakashima, Moriguchi (JP); Ryuzo Hagihara, Moriguchi (JP); Takayoshi Abe, Moriguchi (JP)

(73) Assignee: Sanyo Electric Co., Ltd. (JP)

( * ) Notice: Subject to any disclaimer, the term of this patent is extended or adjusted under 35 U.S.C. 154(b) by 63 days.

(21) Appl. No.: 13/424,483

(22) Filed: Mar. 20, 2012

(65) Prior Publication Data

US 2012/0176079 A1 Jul. 12, 2012

Related U.S. Application Data

(63) Continuation of application No. PCT/JP2010/068167, filed on Oct. 15, 2010.

(30) Foreign Application Priority Data

Oct. 29, 2009 (JP) .................................. 2009-249566
Jul. 30, 2010 (JP) .................................. 2010-172841

(51) Int. Cl.
*H01M 10/44* (2006.01)
*H02J 7/00* (2006.01)

(52) U.S. Cl.
USPC ............ 320/101; 320/117; 320/120; 320/121

(58) Field of Classification Search
CPC ....................................................... H02J 7/35
USPC .......................................................... 320/101
See application file for complete search history.

(56) References Cited

U.S. PATENT DOCUMENTS

2009/0283129 A1* 11/2009 Foss .............................. 136/244
2009/0302681 A1* 12/2009 Yamada et al. ................. 307/46

FOREIGN PATENT DOCUMENTS

| JP | 6-296333 A | 10/1994 |
| JP | 11-103537 A | 4/1999 |
| JP | 2001-218365 A | 8/2001 |
| JP | 2004-23879 A | 1/2004 |
| JP | 2007-330057 A | 12/2007 |
| JP | 2008-148370 A | 6/2008 |
| JP | 2009-153306 A | 7/2009 |
| JP | 2011-15232 A | 8/2011 |

OTHER PUBLICATIONS

International Search Report for International Application No. PCT/JP2010/068167, dated Jan. 18, 2011, with English translation.

* cited by examiner

*Primary Examiner* — Edward Tso
*Assistant Examiner* — Ahmed Omar
(74) *Attorney, Agent, or Firm* — Cantor Colburn LLP

(57) ABSTRACT

A switching circuit capable of efficiently practically using power generated in a plurality of photovoltaic power generation modules is provided. The switching circuit is employed for a power generation system capable of switching a connection state between the plurality of power generation modules, for switching a first connection state where at least a part of the plurality of power generation modules are connected in series with each other, and a second connection state where at least a part of the plurality of power generation modules are connected in parallel with each other, or, the generated power output portion is connected to a storage portion so that generated power is supplied from one of the power generation module to the storage portion.

23 Claims, 20 Drawing Sheets

SWITCHING CIRCUIT, CONTROL APPARATUS, AND POWER GENERATION SYSTEM

CROSS-REFERENCE TO RELATED APPLICATION

The present application is a continuation application of International Application No. PCT/JP2010/068167, filed Oct. 15, 2010, the entire contents of which are incorporated herein by reference and priority to which is hereby claimed. The PCT/JP2010/068167 application claimed the benefit of the date of the earlier filed Japanese Patent Application Nos. JP2009-249566, filed Oct. 29, 2009, and JP2010-172841, filed Jul. 30, 2010, the entire contents of which are incorporated herein by reference, and priority to which is hereby claimed.

BACKGROUND OF THE INVENTION

1. Field of the Invention

The present invention relates to a switching circuit, a control apparatus and a power generation system, and more particularly, it relates to a switching circuit employed for a power generation system including a plurality of power generation modules generating power with renewable energy and a storage portion, a control apparatus, and a power generation system including a switching portion.

2. Description of the Background Art

A power generation system including photovoltaic power generation modules generating power with solar energy which is renewable energy and a storage portion capable of storing the power generated by the photovoltaic power generation modules is known in general. In such a power generation system, it is demanded to efficiently use the power generated in the photovoltaic power generation modules.

A structure raising efficiency for charging power generated in photovoltaic power generation modules into a storage cell is known in general. Such a power generation system is disclosed in Japanese Patent Laying-Open No. 2009-153306, for example.

In the power generation system of the aforementioned Japanese Patent Laying-Open No. 2009-153306, a plurality of photovoltaic power generation modules are regularly connected to a storage portion. Further, the power generation system of the aforementioned Japanese Patent Laying-Open No. 2009-153306 is formed to be capable of switching a connection state between the plurality of photovoltaic power generation modules to a series connection state where the plurality of photovoltaic power generation modules are connected in series with each other and to a parallel connection state where the plurality of photovoltaic power generation modules are connected in parallel with each other. In the aforementioned Japanese Patent Laying-Open No. 2009-153306, output voltage larger than reference voltage of the storage portion is obtained by switching the connection state from the parallel connection state to the series connection state in a case where output voltage of each photovoltaic power generation module is smaller than the reference voltage of the storage portion, whereby it is possible to efficiently perform charging on the storage portion.

Further, a switching circuit capable of switching a connection state (parallel connection, series connection, combined connection of parallel connection and series connection, separation of a specific solar cell or the like) between a plurality of solar cells by connecting the plurality of solar cells with each other through a changeover switch is known in general. Such a switching circuit is disclosed in Japanese Patent Laying-Open No. 11-103537, for example.

In the aforementioned Japanese Patent Laying-Open No. 11-103537, it is possible to output voltage responsive to a load by switching the connection state between the plurality of solar cells in response to the load. In the aforementioned Japanese Patent Laying-Open No. 11-103537, further, it is described that the voltage may be output to the load through a storage apparatus.

In the aforementioned Japanese Patent Laying-Open No. 2009-153306 and the aforementioned Japanese Patent Laying-Open No. 11-103537, however, the capacity of the storage cells (storage apparatus) is not taken into consideration. In a case where the storage cells are fully charged, therefore, the power generated in the photovoltaic power generation modules cannot be stored. In this case, it follows that the unstorable power is discarded, and hence there is such a problem that the power generated in the plurality of photovoltaic power generation modules cannot be efficiently practically used.

While a method of efficiently practically using power generated in photovoltaic power generation modules by making the same reversely flow into a power grid in a case where surplus power is generated is known in general, there are a large number of restrictions in a case of constructing a system obtained by combining photovoltaic power generation modules and storage cells with each other, and it is difficult to efficiently utilize power generated by the photovoltaic power generation modules. While the photovoltaic power generation modules and the power grid are connected with each other through an inverter in a case of adopting a system performing a reverse power flow, for example, driving of the inverter must be stopped when electric service to the power grid is interrupted, and hence the power generated in the photovoltaic power generation modules cannot be utilized.

The present invention has been proposed in order to solve the aforementioned problems, and an object of the present invention is to provide a switching circuit capable of efficiently practically using power generated in a plurality of photovoltaic power generation modules, a control apparatus and a power generation system.

SUMMARY OF THE INVENTION

A switching circuit according to a first aspect of the present invention is a switching circuit employed for a power generation system including a generated power output portion constituted to include a plurality of power generation modules generating power with renewable energy as well as a power converter and a storage portion supplied with power generated in the power generation modules and capable of switching a connection state between the plurality of power generation modules, for switching a first connection state where at least a part of the plurality of power generation modules are connected in series with each other and the generated power output portion is connected to the power converter, and a second connection state where at least a part of the plurality of power generation modules are connected in parallel with each other or the generated power output portion is connected to the storage portion so that generated power is supplied from one of power generation modules to the storage portion. The "power converter" is a concept including a DC-to-DC converter, a Dc-to-AC converter and an AC-to-AC converter.

A control apparatus according to a second aspect of the present invention is a control apparatus employed for a power generation system including a generated power output portion constituted to include a plurality of power generation modules generating power with renewable energy and a switching portion switching a connection state between the plurality of power generation modules as well as a power converter and a storage portion supplied with power generated in the power generation modules, controlling the switching portion to switch a first connection state where at least a part of the plurality of power generation modules are connected in series with each other and the generated power output portion is connected to the power converter, and a second connection state where at least a part of the plurality of power generation modules are connected in parallel with each other or the generated power output portion is connected to the storage portion so that generated power is supplied from one of power generation modules to the storage portion.

A power generation system according to a third aspect of the present invention includes a first generated power output portion constituted to include a plurality of power generation modules generating power with renewable energy and a switching portion switching a connection state between the plurality of power generation modules, and a power converter and a storage portion supplied with power generated in the power generation modules, while the switching portion is formed to be capable of switching a first connection state where at least a part of the plurality of power generation modules are connected in series with each other and the first generated power output portion is connected to the power converter, and a second connection state where at least a part of the plurality of power generation modules are connected in parallel with each other, or, the generated power output portion is connected to the storage portion so that generated power is supplied from one of power generation modules to the storage portion.

According to the present invention, power generated in the plurality of photovoltaic power generation modules can be efficiently practically used in such a structure that the plurality of power generation modules are selectively connected to the storage portion and to the power converter. Further, power generated in the power generation modules can be supplied to each connection target with voltage of a proper magnitude responsive to the connection target (either the power converter or the storage portion). Thus, the structure of the power generation system can be simplified, and power loss resulting from provision of a voltage converter can be prevented. Further, it is possible to effectively contribute to reduction of emissions of $CO_2$.

DESCRIPTION OF THE PREFERRED EMBODIMENTS

Embodiments of the present invention are now described with reference to the drawings.

First Embodiment

First, the structure of a power generation system (photovoltaic power generation system 1) according to a first embodiment of the present invention is described with reference to FIGS. 1 to 3.

Figure 1:
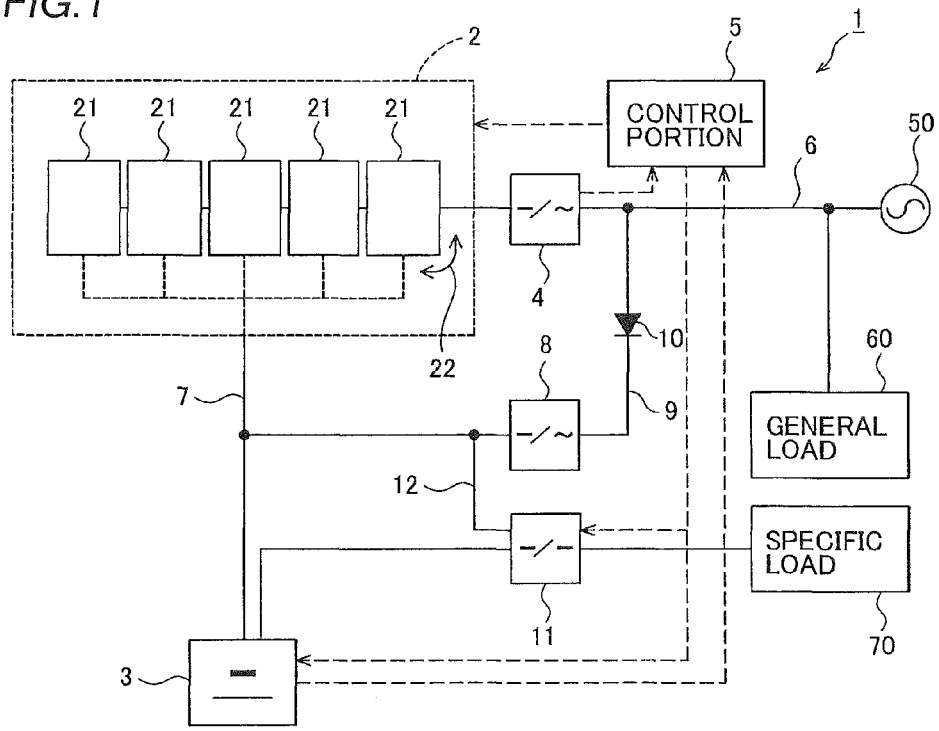
FIG. 1 is a block diagram showing the structure of a power generation system according to a first embodiment of the present invention.

The photovoltaic power generation system 1 according to the first embodiment of the present invention includes a generated power output portion 2 outputting power generated with sunlight, a storage portion 3 capable of storing the power output by the generated power output portion 2, an inverter 4 connected to a power grid 50 for outputting the power output from the generated power output portion 2 to the power grid 50 so that a reverse power flow is possible, and a control portion 5 controlling the generated power output portion 2 and the storage portion 3 etc., as shown in FIG. 1. The inverter 4 is an example of the "power converter" in the present invention, and has a function of converting direct-current power output from the generated power output portion 2 to alternating current. The control portion 5 is an example of the "control apparatus" or the "control portion" in the present invention.

The generated power output portion 2 includes a plurality of (in the first embodiment, five) photovoltaic power generation modules 21 connected with each other and a switching circuit portion 22 selectively (alternatively) switchably connecting power generated by the photovoltaic power generation modules 21 to the side of the inverter 4 or to the side of the storage portion 3. The generated power output portion 2 is an example of the "first generated power output portion" in the present invention, and the switching circuit portion 22 is an example of the "switching portion" or the "switching circuit" in the present invention.

As the photovoltaic power generation modules 21, solar cells having a small temperature coefficient (exhibiting small change of characteristics caused by temperature change) and exhibiting small seasonal fluctuation of maximum output operating voltage are desirably employed. As solar cells having a small temperature coefficient, solar cells (thin-film a-Si, HIT solar cells or the like) employing a-Si or compound-based solar cells such as GaAs-based ones can be listed, for example.

The switching circuit portion 22 is so formed as to electrically cut off connection between the generated power output portion 2 and the storage portion 3 in a case of connecting the generated power output portion 2 to the side of the inverter 4, and as to electrically cut off connection between the generated power output portion 2 and the inverter 4 in a case of connecting the generated power output portion 2 to the side of the storage portion 3. Further, the switching circuit portion 22 is capable of switching a connection state between the five photovoltaic power generation modules 21 to a series connection state where the five photovoltaic power generation modules 21 are connected in series with each other in the case of connecting the generated power output portion 2 to the side of the inverter 4. In addition, the switching circuit portion 22 is capable of switching the connection state between the five photovoltaic power generation modules 21 to a parallel connection state where the five photovoltaic power generation modules 21 are connected in parallel with each other in the case of connecting the generated power output portion 2 to the side of the storage portion 3.

Figure 2:
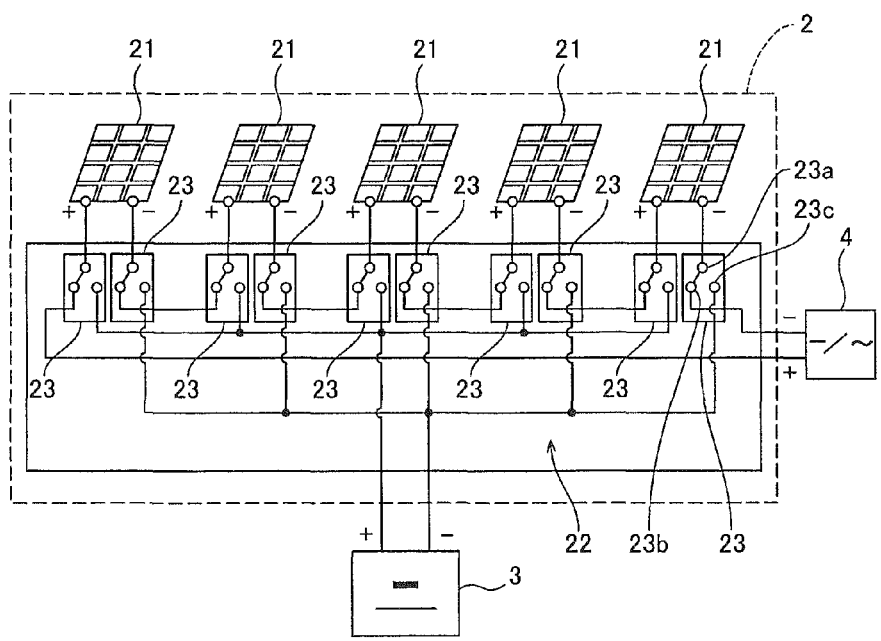
FIG. 2 is a diagram for illustrating a detailed structure of a generated power output portion (series connection state) of the power generation system according to the first embodiment shown in FIG. 1.

As a detailed structure of the generated power output portion 2, the switching circuit portion 22 includes 10 switch circuits 23, as shown in FIG. 2, for example. The respective switch circuits 33 are capable of selectively switching connection between terminals 23a on the side of the photovoltaic power generation modules 21 and terminals 23b in series connection and connection between the terminals 23a on the side of the photovoltaic power generation modules 21 and terminals 23c in parallel connection. The generated power output portion 2 is so formed that the five photovoltaic power generation modules 21 are connected in series with each other and the series-connected five photovoltaic power generation modules 21 are connected to the side of the inverter 4 in a case of connecting the terminals 23a on the side of the photovoltaic power generation modules 21 and the terminals 23b in the series connection with each other in all switch circuits 23, as shown in FIG. 2. Thus, power of voltage corresponding to the total sum of output voltage of each photovoltaic power generation module 21 is input in the inverter 4. In this series connection state, the photovoltaic power generation modules 21 are electrically cut off from the side of the inverter 4.

Figure 3:
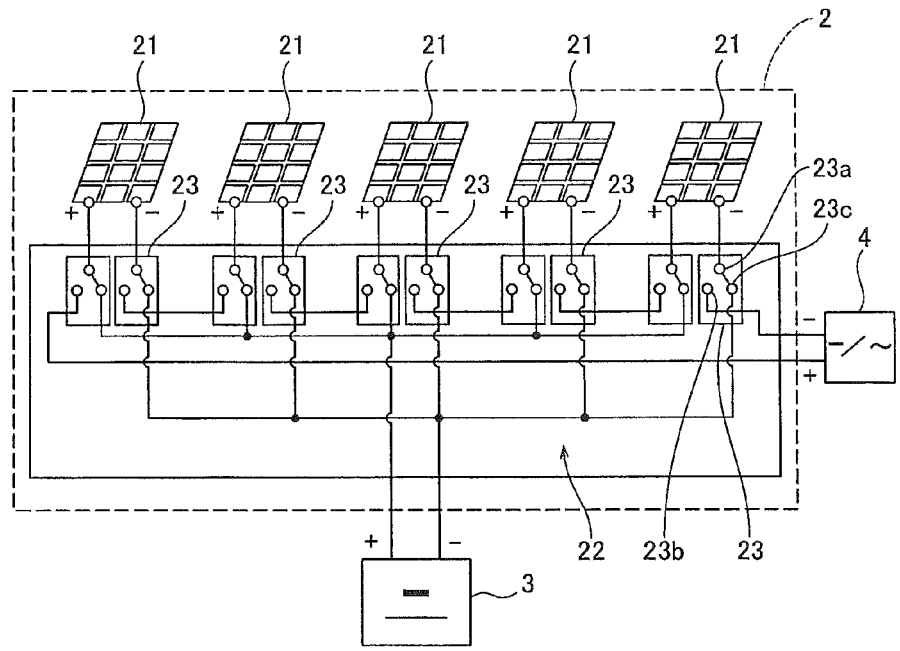
FIG. 3 is a diagram for illustrating a detailed structure of the generated power output portion (parallel connection state) of the power generation system according to the first embodiment shown in FIG. 1.

Further, the generated power output portion 2 is so formed that the five photovoltaic power generation modules 21 are connected in parallel with each other and the parallel-connected photovoltaic power generation modules 21 are connected to the side of the storage portion 3 in a case of connecting the terminals 23a on the side of the photovoltaic power generation modules 21 and the terminals 23c in the parallel connection with each other in all switch circuits 23, as shown in FIG. 3. Thus, power of output voltage whose output voltage has the smallest magnitude among the photovoltaic power generation modules 21 connected with the storage portion 3 is input in the storage portion 3. In this parallel connection state, the photovoltaic power generation modules 21 are electrically cut off from the side of the inverter 4.

Output from the inverter 4 to a bus 6 is designed to become alternating-current output of 200 V in a single-phase three-wire system, so that the same conforms to use of a domestic apparatus (general load 60 described later), for example. In order to efficiently obtain the alternating-current output of 200 V from the inverter 4, input voltage from the generated power output portion 2 into the inverter 4 is desirably direct-current voltage of at least 200 V and not more than 300 V.

The bus 6 connecting the inverter 4 and the power grid 50 with each other and a wire 7 connecting the generated power output portion 2 and the storage portion 3 with each other are connected with each other by a wire 9 through an AC-DC converter 8. Thus, it is possible to supply direct-current power from the power grid 50 to the storage portion 3 through the AC-DC converter 8. The wire 9 is provided with a diode 10 allowing only power directed from the power grid 50 to the storage portion 3. Thus, a reverse power flow from the storage portion 3 into the power grid 50 through the wire 9 is prevented. The generated power output portion 2 and the storage portion 3 are series-connected with each other by the wire 7 without through a voltage converter such as a DC-DC converter.

The general load 60 is connected to the bus 6 connecting the inverter 4 and the power grid 50 with each other. This general load 60 is an apparatus driven by an alternating-current power source in the first embodiment. On the other hand, a specific load 70 is connected to the storage portion 3 through a DC-DC converter 11. This specific load 70 is an apparatus driven by a direct-current power source in the first embodiment. A specific load is an apparatus desired to be regularly supplied with power from a power source, and an apparatus required to regularly operate or an apparatus required to be on standby so that the same is immediately drivable when an operating signal is input, for example, is included. According to the first embodiment, the storage portion 3 and the specific load 70 are connected with each other, whereby power supply to the specific load 70 is performed by the storage portion 3 also in a case where electric service to the power grid 50 is interrupted, and the power supply does not immediately stop.

A portion of the wire 9 closer to the storage portion 3 than the AC-DC converter 8 and the DC-DC converter 11 are connected with each other through a wire 12. Thus, power is supplied from the AC-DC converter 8 not only to the storage portion 3 but also to the DC-DC converter 11 through the wire 12. Thus, system power can be supplied to the specific load 70 through the AC-DC converter 8 also in a case where the quantity of power charged into the storage portion 3 decreases, whereby the power supply to the specific load 70 does not stop. The DC-DC converter 11 has a function of switching connection to select either one of direct-current power from the storage portion 3 and direct-current power from the wire 12. It is possible to select the direct-current power from the storage portion 3 at a normal time, and to electrically cut off the connection between the storage portion 3 and the specific load 70 and to connect the power grid 50 and the specific load 70 with each other in a case where the charging quantity of the storage portion 3 lowers or the like.

The connection switching function of the DC-DC converter 11 may not be built into the DC-DC converter 11, but it is possible to implement a function similar to that of the DC-DC converter 11 by providing a DC-DC converter having no switching function and a switch provided separately from the DC-DC converter in place of the DC-DC converter 11.

While the apparatus driven by the direct-current power source has been shown as the example of the specific load 70, an apparatus driven by an alternating-current power source may be employed. In this case, an inverter is employed in place of the DC-DC converter 11. In this case, the wire 12 may be connected to a side closer to the system power source 50 than the AC-DC converter 8, and may be so formed as to supply power to the specific load 70 without performing AC-DC conversion in the inverter when the charging quantity in the storage portion 3 decreases. Further, apparatuses driven by a direct-current power source and an alternating-current power source may be mixedly present as the specific load 70.

As the storage portion 3, a secondary cell (a lithium ion storage cell, a nickel-hydrogen storage cell or the like, for example) exhibiting a small quantity of natural discharge and having high charging/discharging efficiency is employed. Safe design gets important as the voltage of the storage portion 3 rises, and hence it is desired that the voltage of the storage portion 3 is low. Further, that of a relatively low voltage specification is frequently employed also as to the specific load 70 connected to the storage portion 3, and hence it is desired that the voltage of the storage portion 3 is also low in conformity therewith. Therefore, charging voltage of the storage portion 3 is smaller than the desired input voltage (at least 200 V and not more than 300 V) required to the inverter 4. Nominal voltage (charging voltage) of the storage portion 3 is selected to be lower than nominal maximum output operating voltage of the photovoltaic power generation modules 21. Considering power generation voltage of the photovoltaic power generation modules 21 for efficiently charging the storage portion 3 and temperature dependency of the photovoltaic power generation modules 21, the nominal voltage of the storage portion 3 is more preferably selected to be at least 70% and not more than 90% of the nominal maximum output operating voltage.

The reason for this is now described in more detail. It is known that the voltage of the storage portion 3 rises by about 10% than the normal voltage depending on the charging quantity. Therefore, voltage higher by about 10% than the nominal voltage is necessary in order to perform full charging while generated power abruptly lowers with voltage exceeding Vop, and hence operation with not more than 90% of the nominal maximum power operating voltage (Vop) is preferable. It is also known that Vop lowers at a high-temperature time or the like. In order to maintain voltage higher by at least 10% than the nominal voltage of the storage portion 3 also in lowering of Vop, therefore, storage portion nominal voltage lower than 90% of Vop is necessary. On the other hand, it is also known that power generation efficiency of the photovoltaic power generation modules 21 lowers with operating voltage deviating from Vop. As a result of deep studies conducted by the inventors, they have found that the storage portion 3 can be most efficiently charged by setting the nominal voltage of the storage portion 3 to at least 70% and not more than 90% of Vop. According to the first embodiment, the nominal maximum output operating voltage of the photovoltaic power generation modules 21 is about 60 V, and the nominal voltage (charging voltage) of the storage portion 3 is about 48 V.

A DC-DC converter can be rendered unnecessary in charging of the storage portion 3 by setting the nominal voltage of the storage portion 3 to at least 70% and not more than 90% of Vop, whereby power loss in the converter in a case of employing the DC-DC converter can be suppressed. Thus, high-efficiency charging is possible. Further, no exchanging operation for the DC-DC converter is required and the number of components can be reduced, whereby improvement of reliability and cost reduction resulting from reduction of a failure rate and implementation of a maintenance-free state over a long period are expected.

The control portion 5 has a function of controlling the switching circuit portion 22 of the generated power output portion 2, the storage portion 3, the AC-DC converter 8 and the DC-DC converter 11 etc. on the basis of the quantity of power generation of the generated power output portion 2, the charging quantity of the storage portion 3, the operating situation of the inverter 4 and preset set information etc. More specifically, the control portion 5 determines whether the system is in normal operation or in unnormal operation on the basis of the charging quantity of the storage portion 3, the operating situation of the inverter 4 and the preset set information etc.

The normal operation is a state where the power grid 50 normally operates. The unnormal operation is a case where an inconvenience takes place in the power grid for some reason or a case where there is a possibility that an inconvenience takes place and hence a countermeasure must be previously devised. For example, the control portion 5 determines that the system is in unnormal operation in a case where electric service to the power grid 50 is interrupted, in a case where allowable voltage of a distribution line is exceeded by a reverse power flow from the side of a customer, and in a case of such a specific day that suppression of generated power in nuclear power generation whose generated power is difficult to control is required in relation to electric power demand and power generated by the photovoltaic power generation modules 21.

In a case of determining that the system is in normal operation, the control portion 5 switches the connection state between the switch circuits 23 thereby bringing the power generation modules 21 into the series connection state and switching the connection target of the generated power output portion 2 to the side of the inverter 4, as shown in FIG. 2. In the normal operation, power output from the generated power output portion 2 is consumed in the general load 60, and surplus power is made to reversely flow into the power grid 50. The specific load 70 is driven with the storage portion 3 serving as a power source. In a case where the charging quantity of the storage portion 3 decreases, power is supplied from the power grid 50 to the specific load 70 through the wire 12. For example, the control portion 5 controls the DC-DC converter 11 to connect the power grid 50 and the specific load 70 with each other through the wire 12 in a case where the charging quantity of the storage portion 3 lowers to 50%, for example. Thus, 50% of the charging quantity of the storage portion 3 can be ensured, whereby it is also possible to supply power from the storage portion 3 to the specific load 70 also at a time of interruption of electric service, by controlling the DC-DC converter 11 to connect the storage portion 3 and the DC-DC converter 11 with each other also in a case where no power is supplied from the power grid 50 due to the interruption of electric service or the like. Further, it is possible to reduce difference in depth of discharge of the storage portion 3, whereby it is possible to attain life prolongation of the storage portion 3.

In a case of determining that the system is in unnormal operation, the control portion 5 switches the connection state between the switch circuits 23 thereby bringing the power generation modules 21 into the parallel connection state and switches the connection target of the generated power output portion 2 to the side of the storage portion 3, as shown in FIG. 3. In the unnormal operation, power output from the generated power output portion 2 is supplied to the storage portion 3, and the specific load 70 is driven by the charging power of the storage portion 3 and power output from the generated power output portion 2. The power output from the generated power output portion 2 may be supplied to the specific load 70 through the storage portion 3 as shown in FIG. 1, or the power output from the generated power output portion 2 may be supplied to the specific load 70 without through the storage portion 3 by coupling the generated power output portion 2, the storage portion 3 and a wire to the side of the specific load 70 with each other on one point.

According to the first embodiment, the switching circuit portion 22 switches the connection state between the plurality of photovoltaic power generation modules 21 to the series connection state where the plurality of photovoltaic power generation modules 21 are connected in series with each other in a case where the plurality of (five) photovoltaic power generation modules 21 are connected to the inverter 4, and switches the connection state between the plurality of photovoltaic power generation modules 21 to the parallel connection state where the plurality of photovoltaic power generation modules 21 are connected in parallel with each other in a case where the plurality of photovoltaic power generation modules 21 are connected to the storage portion 3. The switching circuit portion 22 is so formed in this manner that the connection targets of the power generation modules 21 can be selected between the inverter 4 and the storage portion 3, whereby the target of supply of generated power can be changed as necessary. Thus, the power generation modules 21 can be connected to the side of the inverter 4 in a case where the storage portion 3 is fully charged, for example, while the same can be connected to the storage portion 3 when the inverter 4 is stopped, whereby power generated in the plurality of photovoltaic power generation modules 21 can be efficiently practically used. In the case of connecting the plurality of photovoltaic power generation modules 21 to the inverter 4, the plurality of photovoltaic power generation modules 21 are connected in series with each other, whereby power generated in the photovoltaic power generation modules 21 can be supplied to (input into) the inverter 4 with relatively high voltage. In the case of connecting the plurality of photovoltaic power generation modules 21 to the storage portion 3, the plurality of photovoltaic power generation modules 21 are connected in parallel with each other, whereby power generated in the photovoltaic power generation modules 21 can be supplied to the storage portion 3 with voltage relatively lower than that in the case supplied to the inverter 4. Thus, power generated in the photovoltaic power generation modules 21 can be supplied to each connection target with voltage of a proper magnitude responsive to the connection target (either the inverter 4 or the storage portion 3). Thus, occurrence of power loss can be suppressed in both of the case of connecting the plurality of photovoltaic power generation modules 21 to the inverter 4 and the case of connecting the same to the storage portion 3 in the structure in which the plurality of photovoltaic power generation modules 21 are selectively connected to the storage portion 3 and the inverter 4, whereby power generated in the photovoltaic power generation modules 21 can be efficiently practically used.

In the case where the plurality of photovoltaic power generation modules 21 are connected to the storage portion 3, the plurality of photovoltaic power generation modules 21 are so connected in parallel with each other that the voltage of power generated in the photovoltaic power generation modules 21 may not be converted to voltage suitable to the charging voltage of the storage portion 3, whereby no voltage converter such as a DC-DC converter may be provided between the photovoltaic power generation modules 21 and the storage portion 3. Thus, the structure of the power generation system 1 can be simplified, and power loss resulting from provision of a voltage converter can be prevented. Further, power generated in the photovoltaic power generation modules 21 is so efficiently practically used that the quantity of power generation by a power generation method such as thermal power generation emitting $CO_2$ can be reduced, whereby it is possible to effectively contribute to reduction of emissions of $CO_2$.

According to the first embodiment, as hereinabove described, the switching circuit portion 22 is provided with the plurality of switch circuits 23 to switch the series connection state and the parallel connection state of the plurality of photovoltaic power generation modules 21 with the plurality of switch circuits 23, whereby the same can easily switch the series connection state and the parallel connection state by employing the switch circuits 23.

According to the first embodiment, as hereinabove described, the switching circuit portion 22 also performs the switching between the state where the plurality of photovoltaic power generation modules 21 are connected to the inverter 4 and the state where the plurality of photovoltaic power generation modules 21 are connected to the storage portion 3 with the plurality of switch circuits 23 when switching the series connection state and the parallel connection state of the plurality of photovoltaic power generation modules 21 with the plurality of switch circuits 23. The switching circuit portion 22 is so formed in this manner that the same not only can switch the series connection state and the parallel connection state but also can perform the switching of the connection targets of the plurality of photovoltaic power generation modules 21 by employing the switch circuits 23, whereby no dedicated switch for switching the connection targets of the photovoltaic power generation modules 21 may be separately provided.

According to the first embodiment, as hereinabove described, the photovoltaic power generation system 1 is so formed as to connect the plurality of photovoltaic power generation modules 21 to the inverter 4 while switching the connection state between the plurality of photovoltaic power generation modules 21 to the series connection state with the switching circuit portion 22 to output the power generated by the plurality of photovoltaic power generation modules 21 connected in series with each other to the side of the power grid 50 through the inverter 4 in the normal operation and as to connect the plurality of photovoltaic power generation modules 21 to the storage portion 3 while switching the connection state between the plurality of photovoltaic power generation modules 21 to the parallel connection state with the switching circuit portion 22 to supply the power generated by the plurality of photovoltaic power generation modules 21 connected in parallel with each other to the storage portion 3 in the unnormal operation. The power generation system 1 is so formed in this manner that the same can supply the power generated by the plurality of photovoltaic power generation modules 21 to the inverter 4 with high voltage suitable to the input into the inverter 4 due to the series connection in the normal operation, and can supply the power generated by the plurality of photovoltaic power generation modules 21 to the storage portion 3 with low voltage suitable for charging the storage portion 3 due to the parallel connection in the unnormal operation. Thus, the power generation system 1 can connect the power generated by the photovoltaic power generation modules 21 to the power grid 50 through the inverter 4 in the normal operation, and can supply the power generated by the photovoltaic power generation modules 21 to the storage portion 3 to store the power or can supply the power to the specific load 70 in such unnormal operation that the inverter 4 must be stopped or inhibited from operation. Thus, the power generated by the photovoltaic power generation modules 21 can be more efficiently practically used.

According to the first embodiment, as hereinabove described, the specific load 70 is connected to the storage portion 3, and the power generation system 1 is so formed as to store power such as midnight power, for example, supplied from the power grid 50 in the storage portion 3 and as to supply the power stored in the storage portion 3 to the specific load 70 in the normal operation, and as to supply the power generated by the parallel-connected plurality of photovoltaic power generation modules 21 and the power stored in the storage portion 3 to the specific load 70 in the unnormal operation. The power generation system 1 is so formed in this manner that the same outputs the power generated by the photovoltaic power generation modules 21 to the side of the power grid 50 through the inverter 4 in the normal operation and can supply power obtained by totaling the power generated by the photovoltaic power generation modules 21 and the power stored in the storage portion 3 to the load in such unnormal operation that it is difficult to supply the power generated by the photovoltaic power generation modules 21 to the inverter 4. Thus, the power generation system 1 can drive the specific load 70 over a long time by efficiently practically using the power generated by the photovoltaic power generation modules 21 in the unnormal operation.

Modifications of First Embodiment

Figure 4:
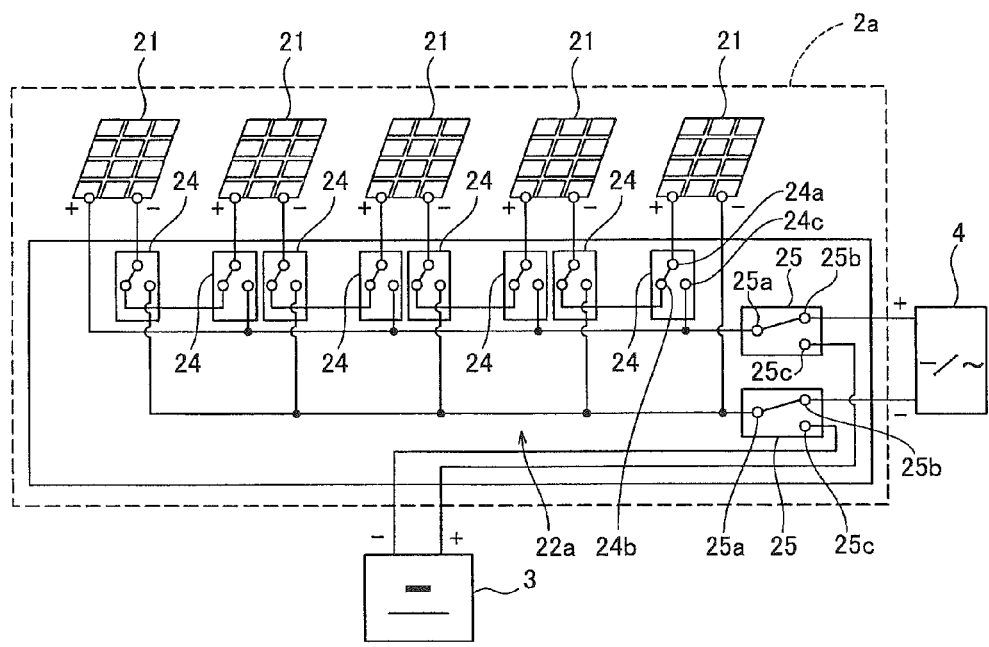
FIG. 4 is a diagram for illustrating a detailed structure of a generated power output portion (series connection state) of a power generation system according to a first modification of the first embodiment of the present invention.
Figure 5:
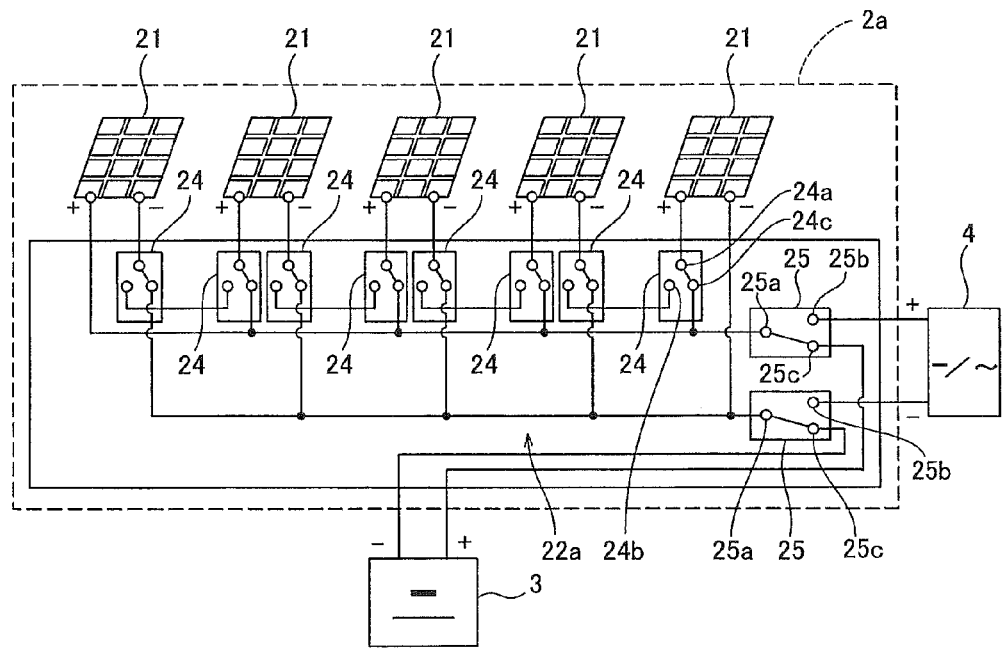
FIG. 5 is a diagram for illustrating a detailed structure of the generated power output portion (parallel connection state) of the power generation system according to the first modification of the first embodiment of the present invention.

While the switching circuit portion 22 of the generated power output portion 2 has employed the switch circuits 23 for the switching between the series connection state and the parallel connection state and the switching of the connection target (the inverter 4 or the storage portion 3) of the generated power output portion 2 in the aforementioned first embodiment, switch circuits 24 for performing switching between a series connection state and a parallel connection state and switch circuits 25 for performing switching of a connection target of a generated power output portion 2a are separately provided on a switching circuit portion 22a in a generated power output portion 2a according to a first modification of the first embodiment shown in FIGS. 4 and 5. The switching circuit portion 22a is an example of the "switching portion" in the present invention, and the switch circuits 24 and the switch circuits 25 are examples of the "first switch circuit" and the "second switch circuit" in the present invention respectively. Further, the generated power output portion 2a is an example of the "first generated power output portion" in the present invention.

In this first modification of the first embodiment, the respective switch circuits 24 are capable of selectively switching connection between terminals 24a on the side of photovoltaic power generation modules 21 and terminals 24b in series connection and connection between the terminals 24a on the side of the photovoltaic power generation modules 21 and terminals 24c in parallel connection. The respective switch circuits 25 are capable of selectively switching connection between terminals 25a on the side of the photovoltaic power generation modules 21 and terminals 25b in series connection and connection between the terminals 25a on the side of the photovoltaic power generation modules 21 and terminals 25c in parallel connection. The generated power output portion 2a is so formed that five photovoltaic power generation modules 21 are connected in series with each other in a case of connecting the terminals 24a on the side of the photovoltaic power generation modules 21 and the terminals 24b in series connection with each other in all switch circuits 24 and the series-connected five photovoltaic power generation modules 21 are connected to the side of an inverter 4 in a case of connecting the terminals 25a on the side of the photovoltaic power generation modules 21 and the terminals 25b in series connection with each other in all switch circuits 25, as shown in FIG. 4. In this series connection state, the photovoltaic power generation modules 21 are electrically cut off from the side of a storage portion 3. Further, the generated power output portion 2a is so formed that the five photovoltaic power generation modules 21 are connected in parallel with each other in a case of connecting the terminals 24a on the side of the photovoltaic power generation modules 21 and the terminals 24c in parallel connection with each other in all switch circuits 24 and the parallel-connected photovoltaic power generation modules 21 are connected to the side of the storage portion 3 in a case of connecting the terminals 25a on the side of the photovoltaic power generation modules 21 and the terminals 25c in series connection with each other in all switch circuits 25, as shown in FIG. 5. In this parallel connection state, the photovoltaic power generation modules 21 are electrically cut off from the side of the inverter 4.

Figure 6:
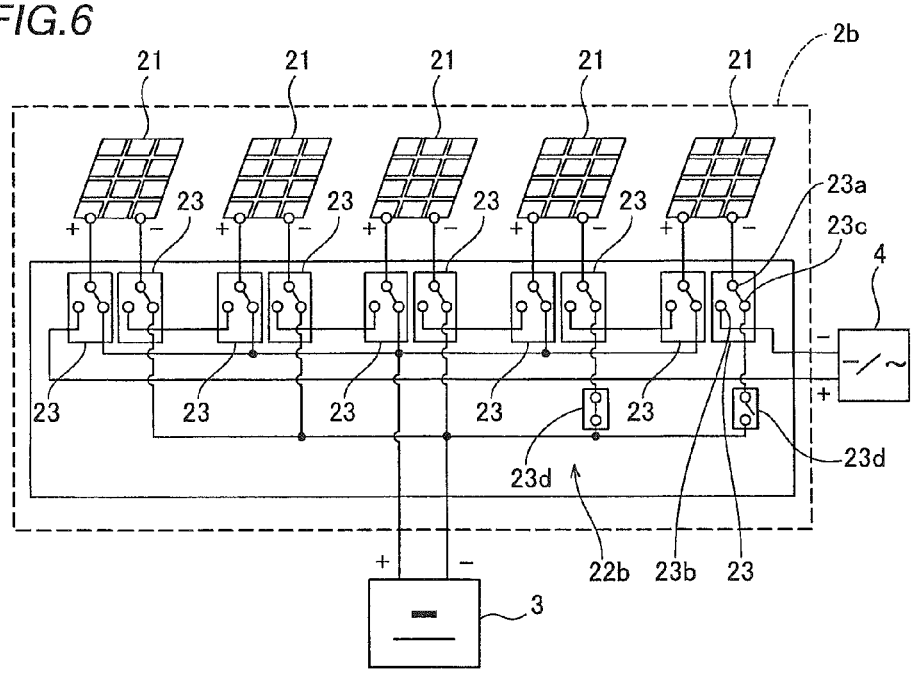
FIG. 6 is a diagram for illustrating a detailed structure of a generated power output portion (series connection state) of a power generation system according to a second modification of the first embodiment of the present invention.

In a generated power output portion 2b according to a second modification of the first embodiment shown in FIG. 6, a switching circuit portion 22b is formed to be capable of connecting partial photovoltaic power generation modules 21 in parallel with each other and connecting the same to a storage portion 3. More specifically, switches 23d capable of cutting off circuits are provided on circuits for connecting five photovoltaic power generation modules 21 in parallel with each other in the switching circuit portion 22b. Referring to FIG. 6, the switches 23d are provided on circuits corresponding to the first and second photovoltaic power generation modules 21 from the right side of the figure. These switches 23d are turned off (the circuits are cut off) so that it is possible not to supply power generated by the photovoltaic power generation modules 21 corresponding to the turned-off switches 23d to the storage portion 3. In the example of FIG. 6, all (five) photovoltaic power generation modules 21 are connected in series with each other and connected to an inverter 4 in the series connection state, regardless of ON/OFF states of the switches 23d. The switching circuit portion 22b is an example of the "switching portion" or the "switching circuit" in the present invention.

In this second modification of the first embodiment, imposition of an excess burden on the storage portion 3 can be suppressed by switching ON/OFF states of the switches 23d in response to the weather or the like. In a case where the weather is cloudy and power generated by the respective photovoltaic power generation modules 21 is small, for example, charging of the storage portion 3 can be more quickly performed by turning on the switches 23d. In a case where the weather is fine and power generated by the respective photovoltaic power generation modules 21 is large, on the other hand, charging of the storage portion 3 can be performed with power generated by partial (three or four) photovoltaic power generation modules 21 without imposing an excess burden on the storage portion 3 by turning off the switches 23d. In the case of providing the switches 23d in plural, all switches 23d may be simultaneously turned on or off, or ON/OFF states thereof may be individually controlled.

While the switches 23d are provided on the circuits corresponding to the two photovoltaic power generation modules 21 in this second modification of the first embodiment, the switches 23d may be provided with respect to one or at least three photovoltaic power generation modules 21. For example, the switches 23d may be provided on circuits corresponding to four photovoltaic power generation modules 21 of FIG. 6 respectively. In this case, it is possible to supply power to the storage portion 3 by parallel connection of the photovoltaic power generation modules 21 by an arbitrary number of two to five, and it is also possible to supply power from one photovoltaic power generation module 21 to the storage portion 3 by simultaneously turning off all switches 23d.

Figure 7:
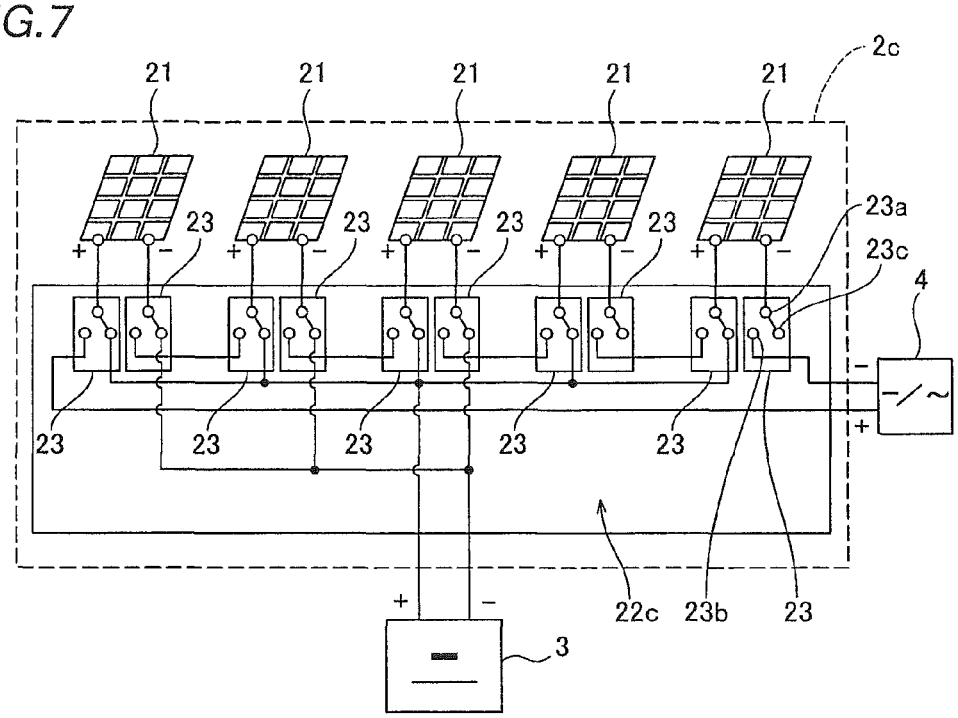
FIG. 7 is a diagram for illustrating a detailed structure of a generated power output portion (series connection state) of a power generation system according to a third modification of the first embodiment of the present invention.

In a generated power output portion 2c according to a third modification of the first embodiment shown in FIG. 7, a switching circuit portion 22c is so formed that partial photovoltaic power generation modules 21 are electrically isolated from other photovoltaic power generation modules 21 and a storage portion 3 or an inverter 4 in a parallel connection state. More specifically, the switching circuit portion 22c is provided with no circuits for parallel connection corresponding to the first and second photovoltaic power generation modules 21 from the right side of the figure. In other words, the generated power output portion 2c is so formed as to supply only power generated by three photovoltaic power generation modules 21 to the storage portion 3 in the parallel connection state in the example of FIG. 7. Also in the example of FIG. 7, all (five) photovoltaic power generation modules 21 are series-connected with each other and connected to the inverter 4 in a series connection state. Preferably, the three photovoltaic power generation modules 21 connected in parallel with each other are connected to the storage portion 3 and the electrically isolated remaining two photovoltaic power generation modules 21 are isolated from both of the storage portion 3 and the inverter 4. The reason for this is described in a third embodiment described later. The switching circuit portion 22c is an example of the "switching portion" or the "switching circuit" in the present invention.

In this third modification of the first embodiment, imposition of an excess burden on the storage portion 3 can be suppressed in charging of the storage portion 3, and the circuit structure can be simplified due to provision of no switches 23d.

Figure 8:
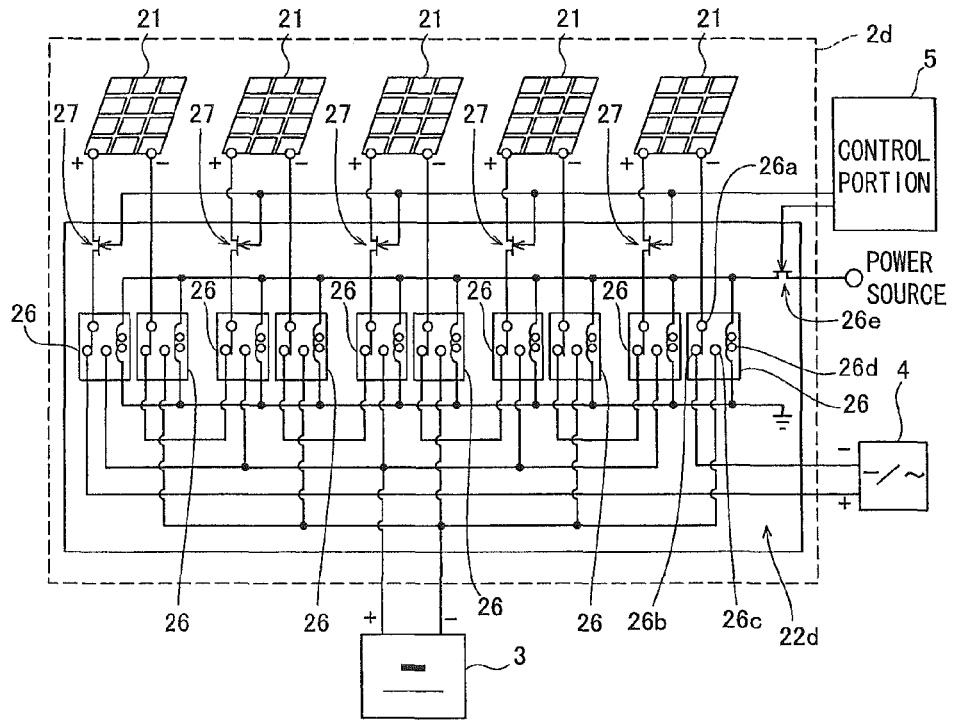
FIG. 8 is a diagram for illustrating a detailed structure of a generated power output portion (series connection state) of a power generation system according to a fourth modification of the first embodiment of the present invention.
Figure 9:
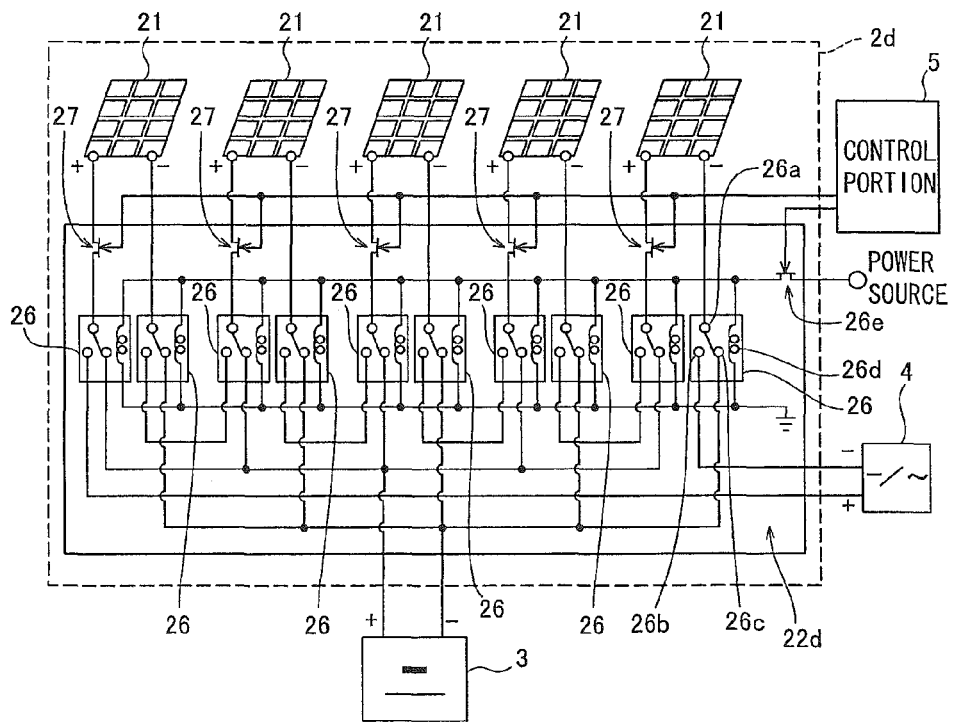
FIG. 9 is a diagram for illustrating a detailed structure of the generated power output portion (parallel connection state) of the power generation system according to the fourth modification of the first embodiment of the present invention.

A generated power output portion 2d according to a fourth modification of the first embodiment shown in FIGS. 8 and 9 is provided with mechanical switch circuits 26 performing switching between a series connection state and a parallel connection state and switching of a connection target (an inverter 4 or a storage portion 3) of the generated power output portion 2d and electronic switch circuits 27 performing switching of inflow and cutoff of current into and from the switch circuits 26. The switch circuits 26 are examples of the "switch circuit" or the "mechanical switch circuit" in the present invention. The switch circuits 27 are examples of the "electronic switch circuit" in the present invention. Further, the generated power output portion 2d is an example of the "first generated power output portion" or the "generated power output portion" in the present invention.

In this fourth modification of the first embodiment, a switching circuit portion 22d includes 10 switch circuits 26, five switch circuits 27 and one changeover switch 26e. The switch circuits 26 are constituted of mechanical relay switches including mechanical contact switching portions having contacts 26a, 26b and 26c and coils (electromagnets) 26d for contact switching. The switching circuit portion 22d is an example of the "switching portion" or the "switching circuit" in the present invention.

Similarly to the aforementioned first embodiment, the respective switch circuits 26 are formed to be capable of selectively switching the contacts 26a on the side of photovoltaic power generation modules 21 to the contacts 26b for connecting the same to the side of an inverter 4 or to the contacts 26c for connecting the same to the side of a storage portion 3. In general, the contacts 26a are connected to either the contacts 26b or the contacts 26c, and connection (switching) between either the contacts 26c or the contacts 26b and the contacts 26a is performed by suction force generated following energization to the coils 26d. First ends of the coils 26d of the respective switch circuits 26 are connected to a power supply path from an external power source, while second ends are grounded. Therefore, the respective switch circuits 26 are so formed that contact switching is simultaneously performed by current supplied to the respective coils 26d from the external power source through the power supply path. When the contacts 26a and the contacts 26b of the respective switch circuits 26 are connected with each other, five photovoltaic power generation modules 21 are connected in series with each other and the five series-connected photovoltaic power generation modules 21 are connected to the side of the inverter 4, as shown in FIG. 8. When the contacts 26a and the contacts 26c of the respective switch circuits 26 are connected with each other, the five photovoltaic power generation modules 21 are connected in parallel with each other and the parallel-connected five photovoltaic power generation modules 21 are connected to the side of the storage portion 3, as shown in FIG. 9.

The electronic changeover switch 26e is provided between the coils 26d of the respective switch circuits 26 and the external power source. The changeover switch 26e is so formed as to switch supply and cutoff of current to and from the coils 26d in response to control signals from a control portion 5. Thus, switching control of a connection state by the control portion 5 is performed.

The five switch circuits 27 consist of electronic contactless FET (field-effect transistor) switches respectively, and provided one by one between the switch circuits 26 and the photovoltaic power generation modules 21 (on anode sides). The respective switch circuits 27 are so formed as to switch the inflow and the cutoff of the current into and from the switch circuits 26 on the basis of control signals from the control portion 5. In this fourth modification of the first embodiment, the control portion 5 first turns off (cuts off) the respective switch circuits 27 to cut off the current to the respective switch circuits 26 when performing connection switching of the respective switch circuits 26. Then, the control portion 5 outputs control signals to the changeover switch 26e in the state where the current to the respective switch circuits 26 is cut off by the respective switch circuits 27, whereby connection switching of the respective switch circuits 26 is executed. Thus, contact switching of the switch circuits 26 can be performed in the state cutting off the current also in the case of employing the mechanical switch circuits 26, whereby it is possible to improve reliability in the contact switching, and life prolongation of the mechanical switch circuits 26 can be attained.

While the example of providing the five electronic switch circuits 27 in total on the respective ones of the five photovoltaic power generation modules 21 has been shown in the aforementioned fourth modification of the first embodiment, an electronic switch circuit may be provided on a confluence of circuits. In this case, the number of electronic switch circuits can be reduced, whereby the circuit structure can be simplified.

Figure 10:
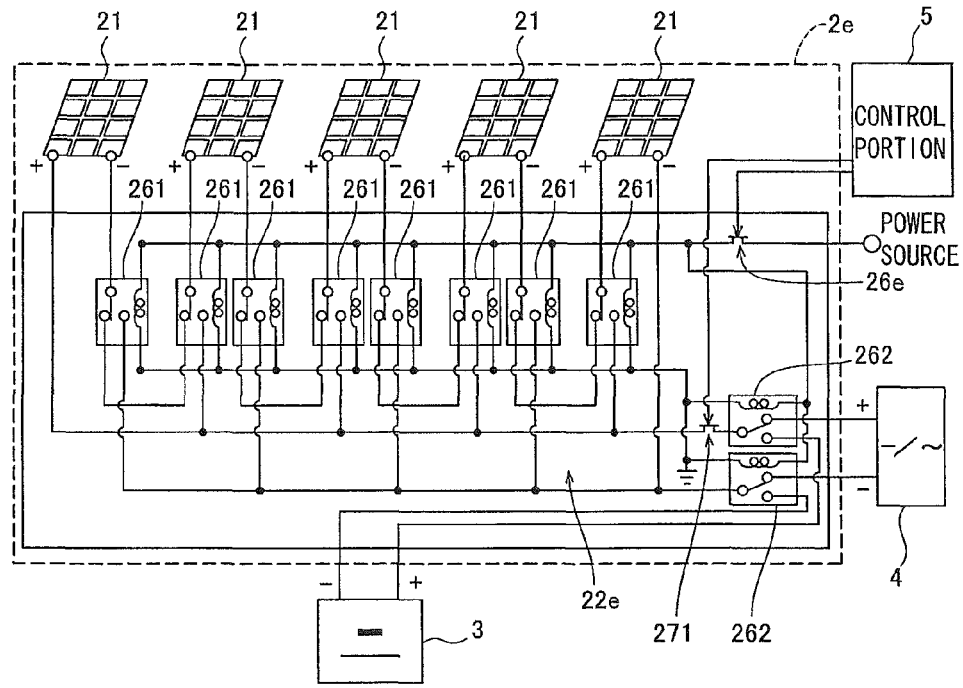
FIG. 10 is a diagram for illustrating a detailed structure of a generated power output portion (series connection state) of a power generation system according to a fifth modification of the first embodiment of the present invention.
Figure 11:
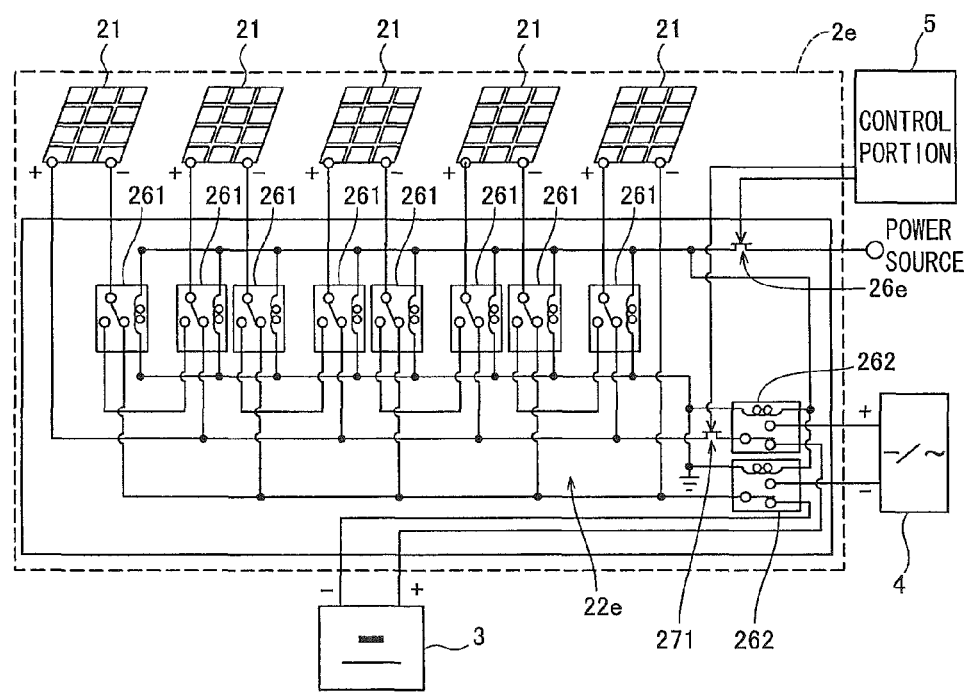
FIG. 11 is a diagram for illustrating a detailed structure of the generated power output portion (parallel connection state) of the power generation system according to the fifth modification of the first embodiment of the present invention.

More specifically, a switch circuit 271 is provided on a confluence portion of current paths (circuits) from five photovoltaic power generation modules 21 in a switching circuit portion 22e, as in a generated power output portion 2e according to a fifth modification of the first embodiment shown in FIGS. 10 and 11. The circuit structure of the switching circuit portion 22e is similar to that of the switching circuit portion 22a shown in FIGS. 4 and 5. In other words, switching of series connection and parallel connection between respective photovoltaic power generation modules 21 is performed in mechanical switch circuits 261 and switching of a connection target (an inverter 4 or a storage portion 3) is performed by mechanical switch circuits 262 in the switching circuit portion 22e according to this fifth modification of the first embodiment. In both of a case (see FIG. 10) of connecting the respective photovoltaic power generation modules 21 to the side of the inverter 4 by series connection and a case (see FIG. 11) of connecting the respective photovoltaic power generation modules 21 to the side of the storage portion 3 in parallel connection, current from the respective photovoltaic power generation modules 21 passes through the switch circuits 262. Therefore, the switching circuit portion 22e is provided with one electronic switch circuit 271 on a position immediately in front of the switch circuits 262 (on the side of the photovoltaic power generation modules 21). Thus, contact switching of the switch circuits 261 (262) can be performed in a state of cutting off the current also in the case of employing the mechanical switch circuits 261 and 262, by simply providing one electronic switch circuit 271. The switch circuits 261 and 262 are examples of the "switch circuit" or the "mechanical switch circuit" in the present invention. The switch circuit 271 is an example of the "electronic switch circuit" in the present invention. Further, the generated power output portion 2e is an example of the "first generated power output portion" or the "generated power output portion" in the present invention. In addition, the switching circuit portion 22e is an example of the "switching portion" or the "switching circuit" in the present invention.

Second Embodiment

A power generation system (photovoltaic power generation system 1a) according to a second embodiment of the present invention is now described with reference to FIGS. 2, 3 and 12. In this second embodiment, an example of attaching importance to charging of a storage portion 3 and performing control of attaining parallel connection in general is described, dissimilarly to the aforementioned first embodiment attaching importance to connection with the power grid 50 and performing control of attaining series connection in general. A structure other than control of a control portion 5a is similar to the structure of the aforementioned first embodiment shown in FIG. 1, and hence description is omitted. The control portion 5a is an example of the "control apparatus" in the present invention.

Figure 12:
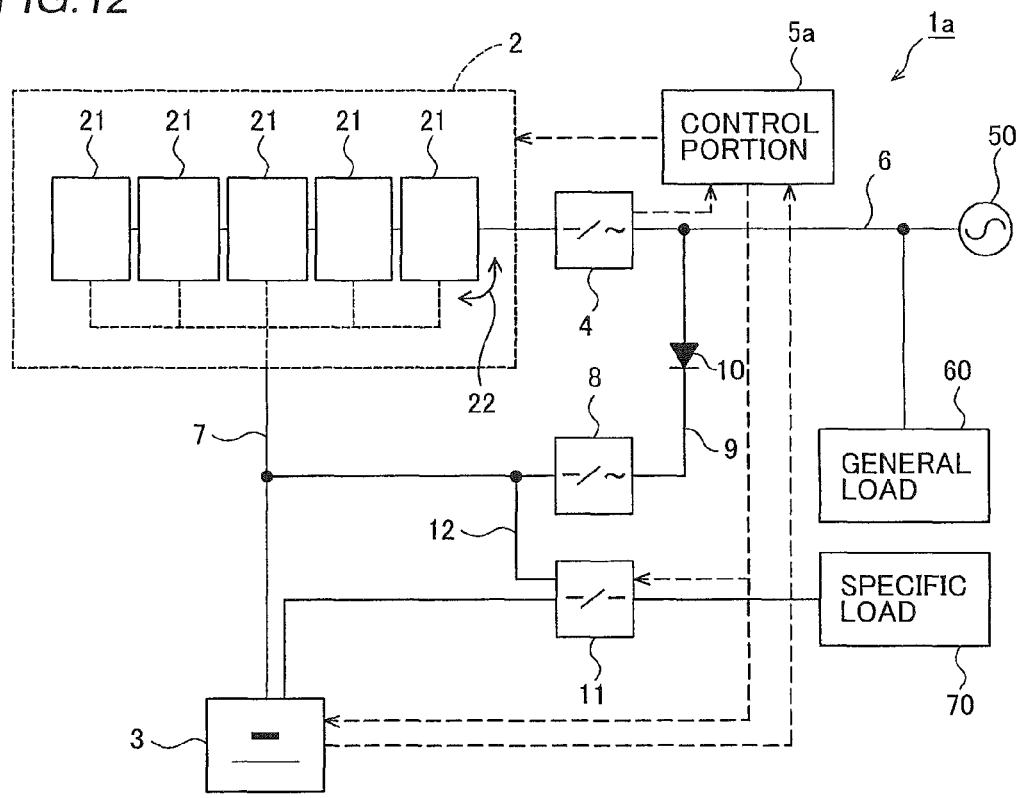
FIG. 12 is a block diagram showing the structure of a power generation system according to a second embodiment of the present invention.

As shown in FIG. 12, the control portion 5a of the photovoltaic power generation system 1a according to the second embodiment has a function of controlling a switching circuit portion 22 of a generated power output portion 2, a storage portion 3, an AC-DC converter 8 and a DC-DC converter 11 etc. on the basis of the quantity of power generation of the generated power output portion 2, the charging quantity of the storage portion 3, the operating situation of the inverter 4 and preset set information etc. More specifically, the control portion 5a determines whether or not it is possible to cover power supplied to a specific load 70 with power stored in the storage portion 3 over a long time on the basis of the charging quantity of the storage portion 3, the operating situation of the inverter 4 and the preset set information etc. A case where the storage portion 3 is fully charged or exhibits a charging quantity close thereto or a case where the quantity of power used in the specific load 70 is small, for example, corresponds to a case where it is possible to cover the power supplied to the specific load 70 with the power stored in the storage portion 3. The control portion 5a monitors the quantity of power used in the specific load 70 etc. by detecting the charging quantity of the storage portion 3 and the amount of change in the charging quantity.

When determining that there is a possibility that the power supplied to the specific load 70 cannot be covered with the power stored in the storage portion 3, the control portion 5a switches a connection state of switch circuits 23 thereby bringing the same into a parallel connection state and switches a connection target of the generate power output portion 2 to the side of the storage portion 3, as shown in FIG. 3. When the control portion 5a determines that there is a possibility that the power supplied to the specific load 70 cannot be covered with the power stored in the storage portion 3, power output from the generated power output portion 2 is supplied to the storage portion 3, and the specific load 70 is driven by charging power of the storage portion 3 and the power output from the generated power output portion 2.

When determining that it is possible to cover the power supplied to the specific load 70 with the power stored in the storage portion 3, on the other hand, the control portion 5a switches the connection state of the switch circuits 23 thereby bringing the same into a series connection state and switches the connection target of the generated power output portion 2 to the side of the inverter 4, as shown in FIG. 2. In this case, the power output from the generated power output portion 2 is consumed in a general load 60, and surplus power is made to reversely flow into a power grid 50. The specific load 70 is driven with the storage portion 3 serving as a power source.

In a case where the charging quantity of the storage portion 3 decreases, the control portion 5a brings the switch circuits 23 into the parallel connection state on the basis of the quantity of power generation of the generated power output portion 2 and a load quantity of the specific load 70 etc., switches the switching circuit portion 22 to connect the generated power output portion 2 to the side of the storage portion 3 and connects the DC-DC converter 11 to the side of the storage portion 3, thereby performing charging of the charging portion 3 and power supply to the specific load 70. Alternatively, the control portion 5a connects the DC-DC converter 11 to the side of the power grid 50, thereby supplying power of the power grid 50 to the specific load 70 through the AC-DC converter 8 and a wire 12. The control portion 5a may not only supply power from the power grid 50 to the specific load 70, but may also charge the storage portion 3. It is possible to employ the generated power output portion 2 and the power grid 50 as power sources for this charging.

According to the second embodiment, as hereinabove described, the photovoltaic power generation system 1a is so formed as to connect a plurality of photovoltaic power generation modules 21 to the storage portion 3 while switching the connection state between the plurality of photovoltaic power generation modules 21 to the parallel connection state with the switching circuit portion 22 for supplying power generated by the plurality of photovoltaic power generation modules 21 connected in parallel with each other and power stored in the storage portion 3 to the specific load 70 when determining that there is a possibility that the power supplied to the specific load 70 cannot be covered with the power stored in the storage portion 3 and as to connect the plurality of photovoltaic power generation modules 21 to the inverter 4 while switching the connection state between the plurality of photovoltaic power generation modules 21 to the series connection state with the switching circuit portion 22 so that the power generated by the plurality of photovoltaic power generation modules 21 connected in series with each other is reversely flowable into the power grid 50 through the inverter 4 while supplying the power stored in the storage portion 3 to the specific load 70 when the power supplied to the load can be covered with the power stored in the storage portion 3. The photovoltaic power generation system 1a is so formed in this manner that the same can supply the power generated by the plurality of photovoltaic power generation modules 21 to the storage portion 3 with relatively low voltage suitable for charging the storage portion 3 when determining that there is a possibility that the power supplied to the specific load 70 cannot be covered with the power stored in the storage portion 3 while the same can supply the power generated by the plurality of photovoltaic power generation modules 21 to the inverter 4 with relatively high voltage suitable to input in the inverter 4 so that the same is reversely flowable into the power grid 50 when the power supplied to the specific load 70 can be covered with the power stored in the storage portion 3 in a case of full charging or in a case where the quantity of power consumed in the specific load 70 is small. As a result of this, the power generated in the photovoltaic power generation modules 21 can be more efficiently practically used as compared with a case of using the photovoltaic power generation modules 21 only for the charging to the storage portion 3.

The remaining effects are similar to those of the aforementioned first embodiment.

Modification of Second Embodiment

Figure 13:
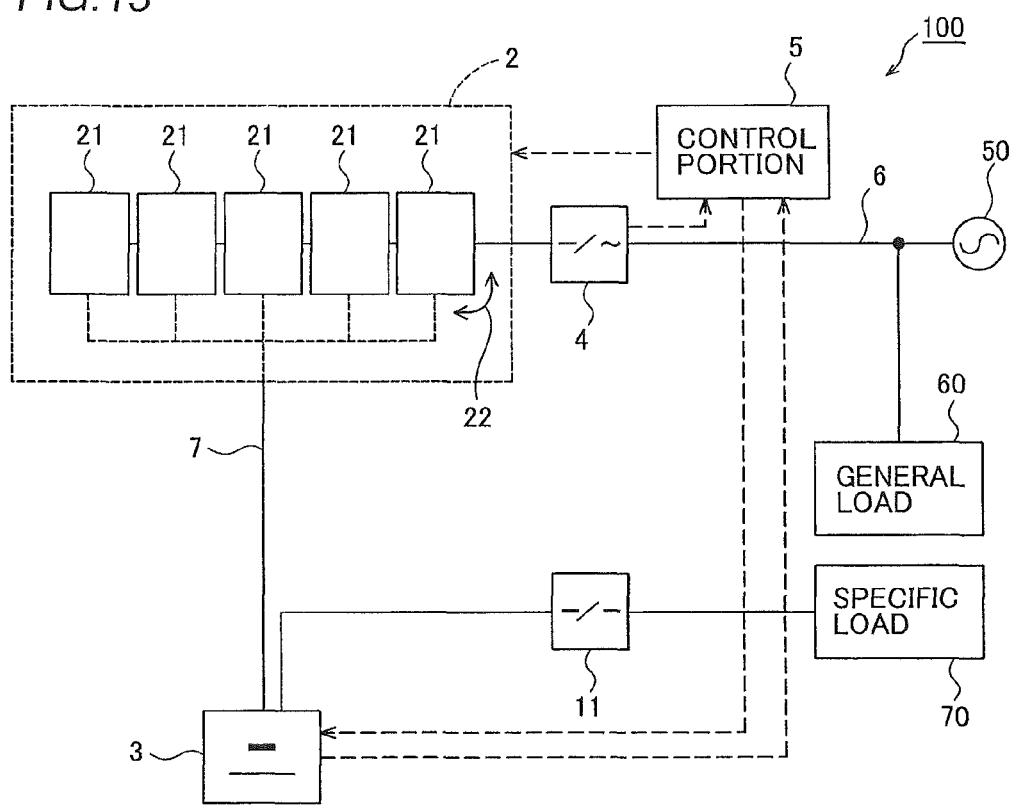
FIG. 13 is a block diagram showing the structure of a power generation system according to a modification of the second embodiment of the present invention.

While the power generation system 1a has been formed to be capable of supplying power from the power grid 50 to the storage portion 3 through a wire 9 and the AC-DC converter 8 in the aforementioned second embodiment, a photovoltaic power generation system 100 according to a modification of the second embodiment shown in FIG. 13 is not provided with a wire 9 and an AC-DC converter 8. The photovoltaic power generation system 100 may be formed in this manner to be brought into a structure of switching the switching circuit portion 22 to a parallel side and charging the same in a case where the charging quantity thereof lowers or the like and switching the switching circuit portion 22 to a series side in a fully charged state or in a case of at least a specific charging quantity, for example. This modification is particularly effective when power consumed by a specific load 70 is small as compared with the storage capacity of the storage portion 3.

Third Embodiment

A power generation system (photovoltaic power generation system 200) according to a third embodiment of the present invention is now described with reference to FIG. 14. In this third embodiment, an example of further providing generated power output portions 201 regularly connected to an inverter 4 is described, dissimilarly to the aforementioned first embodiment.

The photovoltaic power generation system 200 according to the third embodiment is provided with two generated power output portions 201 regularly connected to the inverter 4, in addition to the structure of the aforementioned first embodiment. In each generated power output portion 201, five photovoltaic power generation modules 21 are connected in series with each other. The generated power output portions 201 are examples of the "second generated power output portion" in the present invention. One generated power output portion 2 and the two generated power output portions 201 are connected in parallel with each other, and connected to the inverter 4. In the photovoltaic power generation system 200, it is possible to connect all of the three generated power output portions (one generated power output portion 2 and the two generated power output portions 201) to the inverter 4, and it is also possible to connect the two generated power output portions 201 to the inverter 4 while connecting one generated power output portion 2 to a storage portion 3. In a case of employing the generated power output portion 2b or 2c shown in FIG. 6 or 7 in place of the generated power output portion 2 in the third embodiment, it is preferable that the photovoltaic power generation modules 21 connected in parallel with each other are connected to the storage portion 3 and electrically isolated photovoltaic power generation modules 21 (hereinafter referred to as isolated modules) are isolated from both of the storage portion 3 and the inverter 4. The reason for this is described. In other words, supposing that the isolated modules are connected to the inverter 4, it follows that the generated power output portions 201 and isolated modules smaller than output voltage of the generated power output portions 201 are simultaneously connected in parallel with the inverter 4. In this case, the output voltage of the generated power output portions 201 is so dragged by output voltage of the isolated modules that loss of output power of the whole takes place. For the aforementioned reason, the isolated modules are preferably isolated from both of the storage portion 3 and the inverter 4. This also applies to a first modification and a second modification of the third embodiment described later.

According to the third embodiment, as hereinabove described, the generated power output portions 201 regularly connected to the inverter 4 are further provided in addition to the generated power output portion 2 whose connection target is switchable, whereby power generated by the generated power output portions 201 can be rendered reversely flowable through the inverter 4 while outputting power generated by the generated power output portion 2 to the storage portion 3.

Modifications of Third Embodiment

Figure 15:
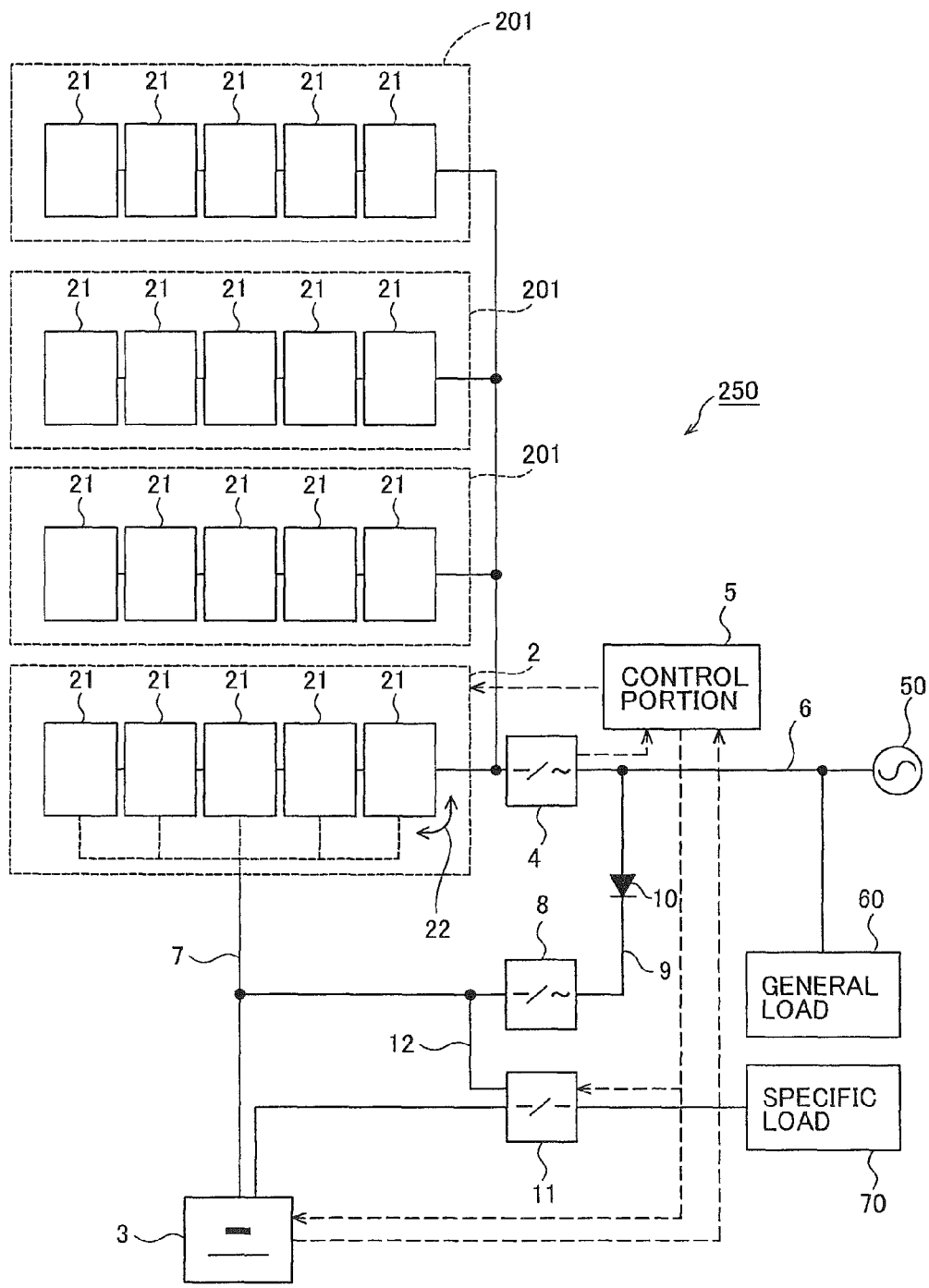
FIG. 15 is a block diagram showing the structure of a power generation system according to a first modification of the third embodiment of the present invention.

While the photovoltaic power generation system 200 according to the third embodiment has been provided with the two generated power output portions 201 regularly connected to the inverter 4, three generated power output portions 201 regularly connected to an inverter 4 may be provided, as in a photovoltaic power generation system 250 according to the first modification of the third embodiment shown in FIG. 15. Thus, the number of the generated power output portions 201 is freely changeable.

Figure 16:
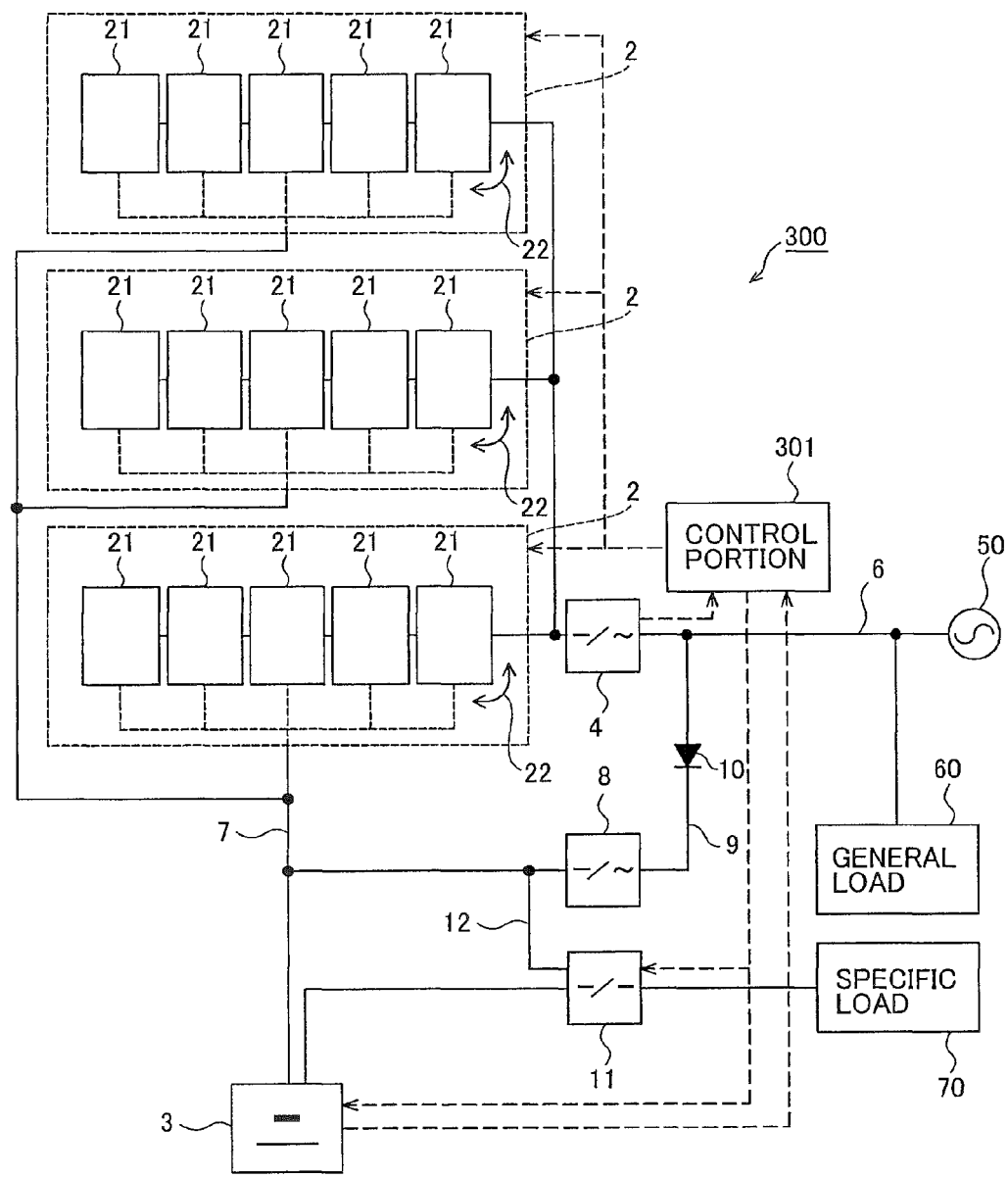
FIG. 16 is a block diagram showing the structure of a power generation system according to a second modification of the third embodiment of the present invention.

While the generated power output portions 201 regularly connected to the inverter 4 have been provided in the third embodiment, a photovoltaic power generation system 300 according to the second modification of the third embodiment shown in FIG. 16 is provided with a plurality of generated power output portions 2. In this case, power output to a storage portion 3 and power made to reversely flow into a power grid 50 can be adjusted stepwise by individually controlling connection targets (the storage portion 3 or an inverter 4) of the respective generated power output portions 2 with a control portion 301. For example, it is possible to connect all of three generated power output portions 2 to the inverter 4 or the storage portion 3, it is also possible to connect one generated power output portion 2 to the inverter 4 while connecting two generated power output portions 2 to the storage portion 3, and it is also possible to connect two generated power output portions 2 to the inverter 4 while connecting one generated power output portion 2 to the storage portion 3. Thus, power generated by photovoltaic power generation modules 21 can be more efficiently practically used. The control portion 301 is an example of the "control apparatus" or the "control portion" in the present invention.

According to each of the third embodiment and the first and second modifications thereof, the following effects can be attained in particular: In other words, the quantity of power generation of the photovoltaic power generation modules and the capacity of the storage portion 3 can be properly selected in response to the quantity of the general load and the quantity of the specific load. In a case where the quantity of the general load is large and the quantity of the specific load is small, for example, the capacity of the storage portion 3 may be small, and hence the number of series-parallel switchable generated power output portions may be small, and it is possible to properly correspond thereto in response to the situation of each customer.

Also with respect to a problem (overvoltage) exceeding allowable voltage of a distribution line by a reverse power flow from the side of the customer, the quantity of the reverse power flow can be suppressed while maximally utilizing power generation ability of the photovoltaic power generation modules to the utmost. In other words, while the quantities of power generation on the side of all of the three generated power output portions must be suppressed when suppressing output power in a system provided with no series-parallel switchable generated power output portions (a case where all of the three generated power output portions of FIG. 14 are not series-parallel switchable), output to the side of the power grid 50 can be reduced to $2/3$ without suppressing output of each generated power output portion in the example of FIG. 14, by switching output of one generated power output portion to the side of the storage portion 3. In the example of FIG. 16, it becomes possible to cope with the problem of the overvoltage further stepwise (to adjust the quantity of output power to the power grid 50). In other words, this modification is effective in a case where no overvoltage takes place when partial generated power is not made to reversely flow while overvoltage takes place when all of power generated in the generated power output portions 2 is made to reversely flow into the power grid 50. Also as to generated power output portions switched to a parallel side, generated power can be utilized for charging the storage portion 3 or in the specific load 70 and hence the respective generated power output portions can be efficiently utilized.

The remaining effects of the third embodiment and the modifications thereof are similar to those of the aforementioned first embodiment.

Figure 14:
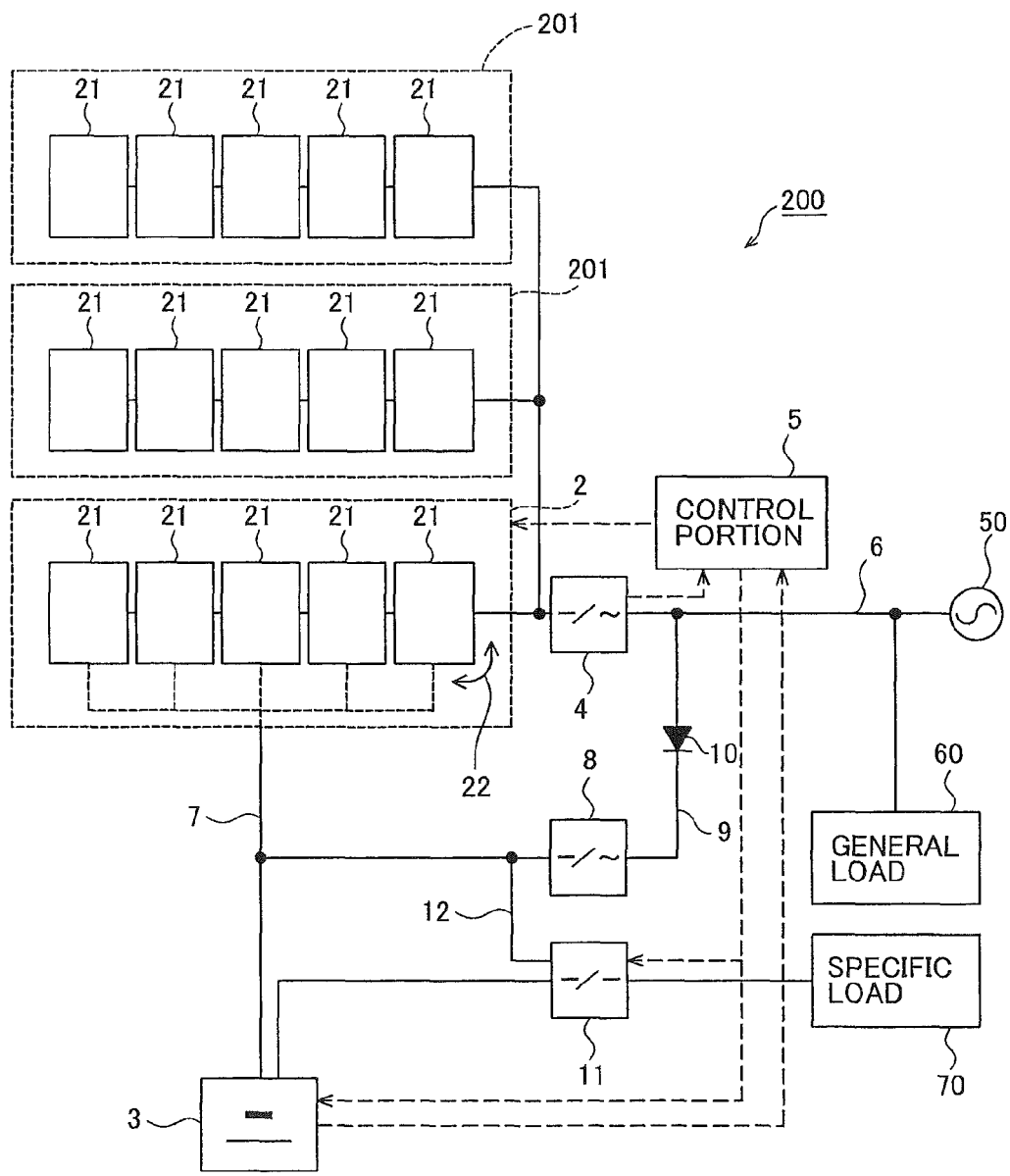
FIG. 14 is a block diagram showing the structure of a power generation system according to a third embodiment of the present invention.

One of the three generated power output portions is formed to be series-parallel switchable in FIG. 14, while all three are formed to be series-parallel switchable in FIG. 16. How many generated power output portions are formed to be series-parallel switchable among the plurality of generated power output portions is arbitrarily changeable.

Fourth Embodiment

Figure 17:
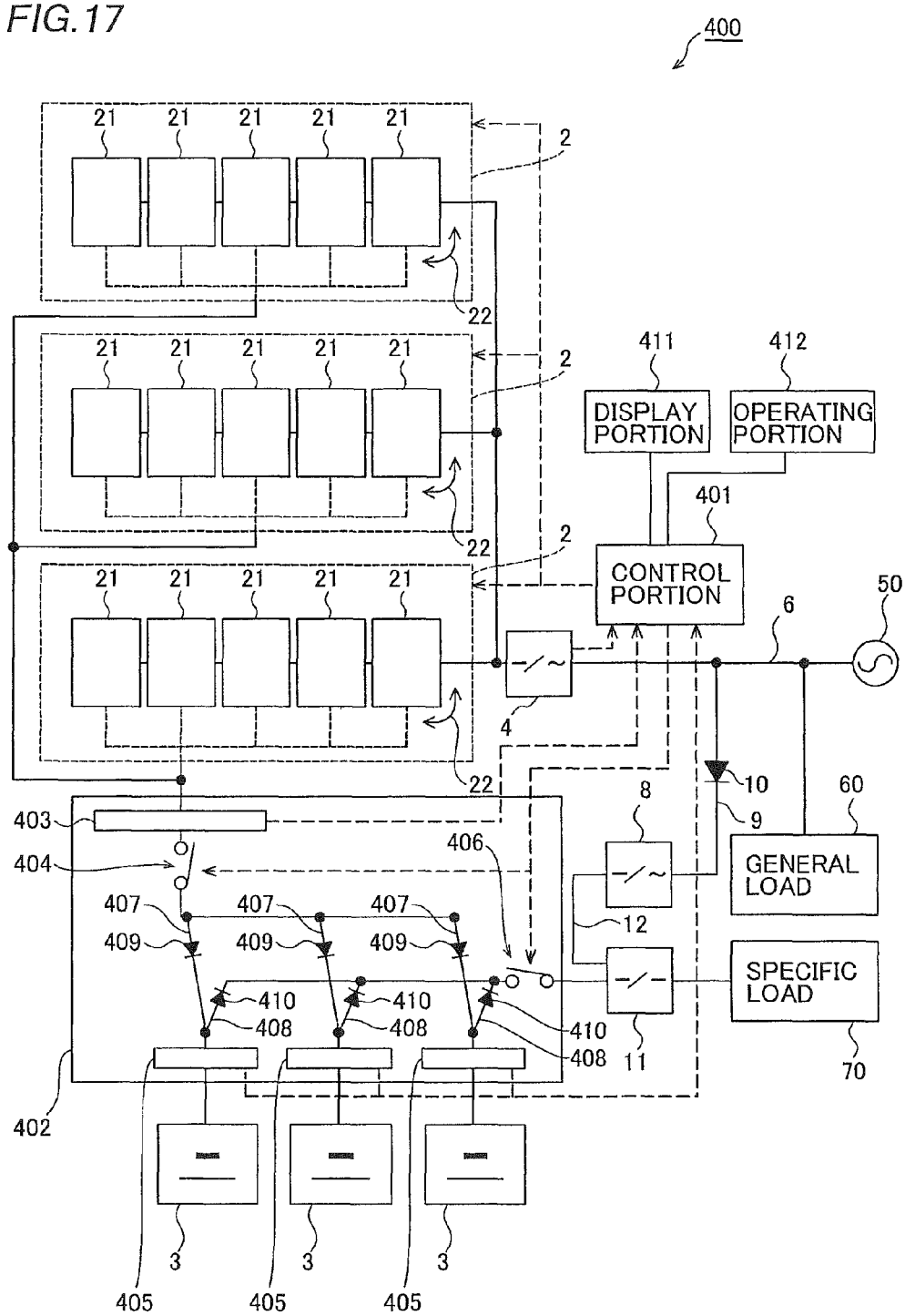
FIG. 17 is a block diagram showing the structure of a power generation system according to a fourth embodiment of the present invention.

A power generation system (photovoltaic power generation system 400) according to a fourth embodiment of the present invention is now described with reference to FIG. 17. In this fourth embodiment, an example of providing a current measuring portion measuring the value of the current flowing into storage portions 3 and performing switching control of connection targets (the storage portions 3 or an inverter 4) of respective generated power output portions 3 on the basis of the measured current value in addition to the second modification of the aforementioned third embodiment provided with the plurality of generated power output portions 2 is described. In this fourth embodiment, further, an example of providing a voltage detection portion detecting voltage of the generated power output portions 2 and performing operation confirmation of switching circuit portions 22 on the basis of detection results of the voltage detection portion is described.

The photovoltaic power generation system 400 according to the fourth embodiment is provided with a plurality of (three) generated power output portions 2 connected in parallel with each other and a plurality of (three) storage portions 3 connected in parallel with each other. Similarly to the second modification of the aforementioned third embodiment, a control portion 401 is capable of individually controlling switching of output targets (the storage portions 3 or the inverter 4) of the respective generated power output portions 2. A charging/discharging switch portion 402 is connected between these generated power output portions 2 and the storage portions 3. While the example provided with the three generated power output portions 2 and the three storage portions 3 is described in this fourth embodiment, the number of the generated power output portions 2 and the number of the storage portions 3 are arbitrarily changeable, as described above. The control portion 401 is an example of the "control apparatus" in the present invention.

The charging/discharging switch portion 402 includes a current•voltage measuring portion 403, a charging switch 404, current measuring portions 405 and a discharging switch 406. The charging/discharging switch portion 402 has functions of switching connection and cutoff of the storage portions 3 and the respective generated power output portions 2 and switching connection and cutoff of the storage portions 3 and a specific load 70. Therefore, the charging/discharging switch portion 402 has functions of switching opening/closing of charging-side circuits from the generated power output portions 2 to the storage portions 3 and opening/closing of discharging-side circuits from the storage portions 3 to the specific load 70. The charging-side circuits and the discharging-side circuits are provided with charging-side branch paths 407 and discharging-side branch paths 408 connecting the three storage portions 3 in parallel with each other respectively. The current•voltage measuring portion 403 is an example of the "current measuring portion" or the "voltage detection portion" in the present invention. The charging switch 404 is an example of the "charging switch circuit" in the present invention.

These charging-side branch paths 407 and the discharging-side branch paths 408 are provided with diodes 409 and 410 for preventing reverse flows of current respectively. Thus, only current directed from the generated power output portions 2 toward the storage portions 3 flows in the charging-side branch paths 407 in charging, and only current directed from the storage portions 3 toward the specific load 70 flows in the discharging-side branch paths 408 in discharging.

The current•voltage measuring portion 403 has a function of measuring the value of the current flowing from the generated power output portions 2 to the storage portions 3 and a voltage value. The current•voltage measuring portion 403 is provided on a position closer to the generated power output portions 2 than the three charging-side branch paths 407. Therefore, a current value obtained by totaling the values of current flowing to the side of the storage portions 3 through the three charging-side branch paths 407 is measured in the current•voltage measuring portion 403.

The charging switch 404 is provided between the charging-side branch paths 407 and the current•voltage measuring portion 403, and has a function of switching connection and cutoff (opening/closing of charging circuits) of the storage portions 3 and the respective generated power output portions 2. The photovoltaic power generation system 400 is so formed that opening/closing (connection and cutoff) of the charging switch 404 is performed on the basis of a control signal of the control portion 401. The discharging switch 406 has a function of switching connection and cutoff (opening/closing of discharging circuits) of the storage portions 3 and the specific load 70 on the basis of a control signal of the control portion 401.

The current measuring portions 405 have functions of individually measuring the current flowing to the three storage portions 3 after branching through the charging-side branch paths 407. In the fourth embodiment, therefore, three current measuring portions 405 in total are provided one by one on the charging-side branch paths 407 respectively in response to the three storage portions 3.

In a case of charging the storage portions 3, the charging switch 404 is turned on by the control portion 401, while an output target of one or a plurality of generated power output portions 2 is switched to the side of the storage portions 3. As a result of this, power output from the generated power output portions 2 is supplied to the respective storage portions 3 through the current•voltage measuring portion 403, the charging switch 404, the charging-side branch paths 407 and the respective current measuring portions 405. In a case of discharging the specific load 70 from the storage portions 3, on the other hand, the discharging switch 406 is turned on by the control portion 401, whereby power supply to the specific load 70 is performed through the discharging-side branch paths 408, the discharging switch 406 and a DC-DC converter 11.

According to the fourth embodiment, the control portion 401 acquires a current (measurement result) flowing to the storage portions 3 in charging from the current•voltage measuring portion 403 or the current measuring portions 405. Then, the control portion 401 performs control to connect the generated power output portions 2 and the storage portions 3 with each other by the charging switch 404 and to connect the generated power output portions 2 to the side of the storage portions 3 in a case where the measured current value is not more than rated current of the respective storage portions 3. On the other hand, the control portion 401 performs control to cut off the generated power output portions 2 and the storage portions 3 by the charging switch 404 and to connect the generated power output portions 2 to the side of the inverter 4 in a case where the measured current value is larger than the rated current of the respective storage portions 3. At this time, the control portion 401 is so formed as to control the number of the generated power output portions 2 connected to the storage portions 3 (performing power supply) in response to the value of the current flowing to the storage portions 3 by individually controlling the connection targets of the generated power output portions 2.

According to the fourth embodiment, further, the control portion 401 is connected with a display portion 411 and an operating portion 412. The control portion 401 is formed to be capable of outputting a prescribed display screen to the display portion 411 and accepting operating input of a user through the operating portion 412. According to this fourth embodiment, the control portion 401 is so formed as to perform operation confirming processing of the switching circuit portions 22 in starting of the photovoltaic power generation system 400. More specifically, the control portion 401 performs check processing of a switching operation between series connection and parallel connection of respective photovoltaic power generation modules 21 and a switching operation of connection targets (the inverter 4 and the storage portions 3) of the generated power output portions 2 on the basis of the voltage detected by the current•voltage measuring portion 403. The details of this confirming processing are described later.

The remaining structure of the fourth embodiment is similar to that of the second modification of the aforementioned third embodiment.

Figure 18:
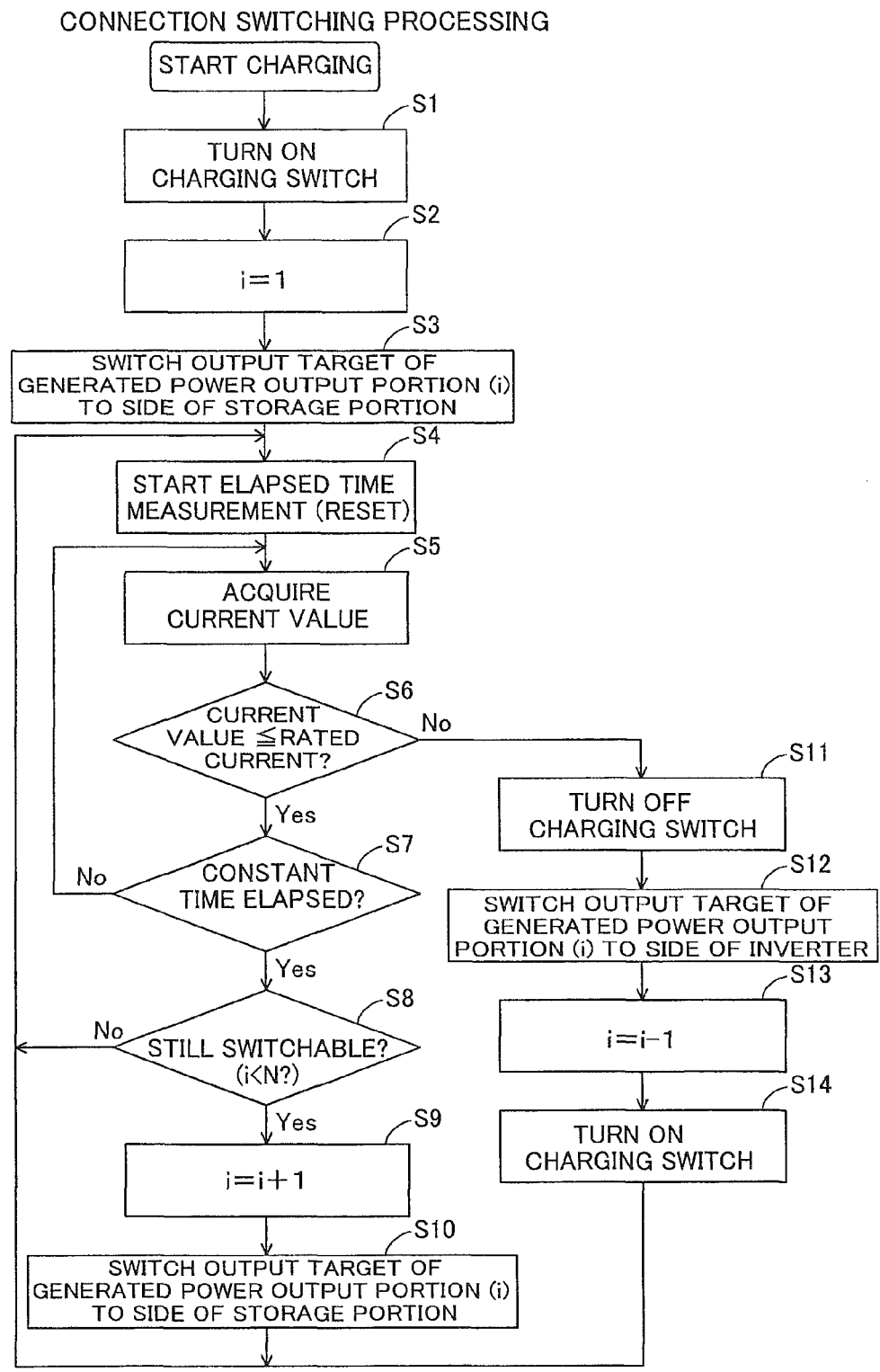
FIG. 18 is a flow chart for illustrating connection switching processing of a generated power output portion of the power generation system according to the fourth embodiment of the present invention.

Connection switching processing of the generated power output portions 2 in charging of the storage portions 3 of the photovoltaic power generation system 400 according to the fourth embodiment is now described with reference to FIGS. 17 and 18. While the number N of the generated power output portions 2 is arbitrarily changeable, a case where N=three generated power output portions 2 are provided is described here.

First, charging to the storage portions 3 is started in a case where the charging quantities of the storage portions 3 are not more than a prescribed value or the like. When charging is started, the charging switch 404 is turned on (closed) by the control portion 401 at a step S1 in FIG. 18. Thus, charging can be started when switching the connection targets of the generated power output portions 2 to the side of the storage portions 3.

At a step S2, the control portion 401 sets the number of the generated power output portions 2 connected to the side of the storage portions 3 to "1". At a step S3, the control portion 401 performs a switching operation of the switching circuit portions 22, whereby the connection target of the first (i=1) generated power output portion 2 is switched to the side of the storage portions 3. As a result of this, power is supplied from the connected generated power output portion 2 to the side of the storage portions 3 and charging is started. At this time, the total value of current flowing to the three storage portions 3 is measured in the current•voltage measuring portion 403, and the value of the current flowing to the corresponding individual storage portions 3 is measured in the respective current measuring portions 405, as shown in FIG. 17. Then, measurement of an elapsed time is started by the control portion 401 at a step S4. This elapsed time is described later.

At a step S5, a measured current value is acquired by the control portion 401. In a case of acquiring a value of current from the current•voltage measuring portion 403, the value of current is acquired by dividing the measured current value by the number N(N=3 here) of the parallel-connected storage portions 3. In a case of acquiring the value of current from the respective current measuring portions 405, the control portion 401 acquires the measured current value as such.

At a step S5, whether or not the acquired the value of current is not more than a rated current value of the storage portions 3 is determined by the control portion 401. In a case where the acquired current value is not more than the rated current value, the control portion 401 advances to a step S7. In a case of acquiring the current value from the respective current measuring portions 405, the control portion 401 advances to the step S7 in a case where all of current values acquired in the respective current measuring portions 405 are not more than the rated current value of the storage portions 3, and advances to the step S1 if there is at least one exceeding value.

At the step S7, whether or not a constant time (two minutes, for example) has elapsed from starting the elapsed time measurement at the step S4 is determined by the control portion 401. In a case where the constant time has not elapsed, the control portion 401 returns to the step S5, so that the current value is acquired again, and comparison with the rated current value is performed at the step S6. When the constant time elapsed without exceeding the rated current value, the control portion 401 advances to a step S8. In other words, the control portion 401 loops between the steps S5 to S7 for the constant time, thereby confirming that the output (current value) of the generated power output portions 2 changing by fluctuation of the weather or the like does not exceed the rated current continuously for this constant time.

In a case where the acquired current value has not exceeded the rated current of the storage portions 3 until the constant time elapses, whether or not the generated power output portions 2 can be switched to the side of the storage portions 3 is determined at the step S8. More specifically, whether or not the number i of the generated power output portions 2 connected to the side of the storage portions 3 is smaller than the total number N of the generated power output portions 2 (i<N?) in the case where the N generated power output portions 2 are provided is determined. In a case where the number i of the generated power output portions 2 connected to the side of the storage portions 3 coincides with N, more generated power output portions 2 cannot be switched to the side of the storage portions 3, and hence the control portion 401 returns to the step S4.

In a case where the generated power output portions 2 can be switched to the side of the storage portions 3, the control portion 401 advances to a step S9, so that "1" is added to the number i of the generated power output portions 2 connected to the side of the storage portions 3 by the control portion 401 (i=i+1). Then, the control portion 401 performs a switching operation of the switching circuit portions 22 at a step S10, whereby the connection target of one generated power output portion 2 is switched to the side of the storage portions 3. Thereafter the control portion 401 returns to the step S4, the elapsed time measurement is reset, and time measurement is started again. Thus, in the case where the value of the current flowing to the side of the storage portions 3 does not exceed the rated current of the storage portions 3 continuously for the constant time, the connection targets of the generated power output portions 2 are switched one by one to the side of the storage portions 3 every lapse of the constant time.

In a case where the current value acquired at the step S5 exceeds the rated current, on the other hand, the control portion 401 advances from the step S6 to a step S11, and the charging switch 404 is turned off (cut off). In a case where a current value exceeding the rated current is acquired when confirming that the current value does not exceed the rated current continuously for the constant time in the loop of the steps S5 to S7, therefore, connection between the storage portions 3 and the generated power output portions 2 is instantaneously cut off. Therefore, it is possible to inhibit current exceeding the rated current from flowing to the storage portions 3.

After the charging switch 404 is turned off, the control portion 401 performs a switching operation of the switching circuit portions 22, whereby the output target of the i-th generated power output portion 2 is switched to the side of the inverter 4. As a result of this, it follows that all generated power output portions 2 are connected to the side of the inverter 4 in a case where one generated power output portion 2 is connected to the side of the storage portions 3 (i=1). In a case where at least two generated power output portions 2 are connected to the side of the storage portions 3 (i=at least 2), the output target of one generated power output portion 2 therein is switched to the side of the inverter 4.

Then, "1" is subtracted from the number i of the generated power output portions 2 connected to the side of the storage portions 3 by the control portion 401 at a step S13 (i=i−1). Then, the charging switch 404 having been turned off (cut off) at the step S11 is turned on at a step S14. Thereafter the control portion 401 returns to the step S4, the elapsed time measurement is reset, and the time measurement is started again. Thus, the connection targets of the generated power output portions 2 are switched one by one to the side of the inverter 4 in the case where the value of the current flowing to the side of the storage portions 3 exceeds the rated current of the storage portions 3. In the case where the current value exceeds the rated current of the storage portions 3, however, the connection targets of the generated power output portions 2 are switched to the side of the inverter 4 without waiting for a lapse of the constant time, and hence the connection targets of the generated power output portions 2 are instantaneously switched to the side of the inverter 4 in a case where a current value exceeding the rated current is still detected after returning from the step S14 to the step S4. Also in a case where the plurality of (for example, N) generated power output portions 2 have been connected to the storage portions 3, therefore, it follows that the connection targets of the generated power output portions 2 are switched to the side of the inverter 4 continuously until the detected current value falls below the rated current of the storage portions 3 in the case where the current value exceeding the rated current is detected.

In a case where the connection targets of all generated power output portions 2 are switched to the side of the inverter 4 (a case of i=0), no current flows to the storage portions 3, and hence the acquired current value becomes zero. Therefore, the acquired current value is determined as regularly not more than the rated current at the step S6. As a result of this, it follows that the connection target of the first generated power output portion 2 is switched to the side of the storage portions 3 through the steps S8 to S10 after a lapse of the constant time.

The aforementioned processing is continuously executed, whereby the connection switching processing of the generated power output portions 2 in charging of the storage portions 3 of the photovoltaic power generation system 400 according to the fourth embodiment is executed.

According to the fourth embodiment, as hereinabove described, switching of the connection targets of the generated power output portions 2 (switching of parallel and series connection of the photovoltaic power generation modules 21) by the switching circuit portions 22 is performed on the basis of the measurement result of the current•voltage measuring portion 403 or the respective current measuring portions 405. Thus, connection between the storage portions 3 and the generated power output portions 2 (photovoltaic power generation modules 21) can be switched in response to the value of the current flowing to the storage portions 3, whereby excess current reducing the lives of the storage portions 3 can be inhibited from flowing in charging of the storage portions 3. Therefore, life prolongation of the storage portions 3 can be attained.

In the fourth embodiment, either the current•voltage measuring portion 403 or the current measuring portions 405 may be provided. In a case of providing only the current•voltage measuring portion 403, current flowing to the parallel-connected plurality of storage portions 3 can be collectively measured, whereby it is possible to simplify an apparatus structure. In a case of providing the current measuring portions 405, on the other hand, connection switching of the generated power output portions 2 (photovoltaic power generation modules 21) can be performed on the basis of the value of current flowing to the respective ones of the parallel-connected respective storage portions 3. In other words, more strict connection switching reflecting individual difference between the respective storage portions 3 can be performed. Therefore, excess current can be more reliably inhibited from flowing to the storage portions 3.

According to the fourth embodiment, as hereinabove described, the control portion 401 controls the switching control portions 22 to switch the generated power output portions 2 to the side of the storage portions 3 in the case where the current value measured by the current•voltage measuring portion 403 or the respective current measuring portions 405 is not more than the rated current and to switch the generated power output portions 2 to the side of the inverter 4 in the case where the measured current value is larger than the rated current. The control portion 401 is so formed in this manner that the generated power output portions 2 are switched to the side of the inverter 4 in the case where the measured current value exceeds the rated current, whereby excess current can be inhibited from flowing to the storage portions 3, while power generated by the generated power output portions 2 can be supplied from the side of the inverter to a general load 60, and surplus power can be can be made to reversely flow into a power grid 50. As a result of this, power generated by the generated power output portions 2 can be efficiently utilized while inhibiting excess current from flowing to the storage portions 3.

According to the fourth embodiment, as hereinabove described, the control portion 401 is so formed as to connect the generated power output portions 2 and the storage portions 3 with each other by the charging switch 404 and as to switch the output targets of the generated power output portions 2 to the side of the storage portions 3 in the case where the current value measured by the current•voltage measuring portion 403 or the respective current measuring portions 405 is not more than the rated current. Further, the control portion 401 is so formed as to cut off the generated power output portions 2 and the storage portions 3 and as to switch the output targets of the generated power output portions 2 to the side of the inverter 4 in the case where the current value measured by the current•voltage measuring portion 403 or the respective current measuring portions 405 is larger than the rated current. The control portion 401 is so formed in this manner that connection and cutoff of the generated power output portions 2 and the storage portions 3 by the charging switch 404 can be performed in addition to switching of the output targets of the generated power output portions 2, whereby the generated power output portions 2 and the storage portions 3 can be instantaneously cut off in the case where the current flowing to the storage portions 3 exceeds the rated current. As a result of this, excess current can be more reliably inhibited from flowing to the storage portions 3.

According to the fourth embodiment, as hereinabove described, the control portion 401 is so formed as to control the number (i) of the generated power output portions 2 connected to the side of the storage portions 3 on the basis of the measurement result (current value) of the current•voltage measuring portion 403 or the respective current measuring portions 405. The control portion 401 is so formed in this manner that power supplied to the side of the storage portions 3 can be adjusted stepwise on the basis of the measurement result (current value). Thus, proper power supply can be performed with respect to the storage portions 3 also in a case where output of the generated power output portions 2 fluctuates due to an external factor such as fluctuation of the weather.

According to the fourth embodiment, the value of the current flowing to the individual storage portions 3 in charging can be inhibited from enlarging by connecting the plurality of (three) storage portions 3 in parallel with each other. In the photovoltaic power generation system 400, therefore, it is hard for the value of the current flowing to the storage portions 3 to exceed the rated current also in the case where the output of the generated power output portions 2 fluctuates due to fluctuation of the weather.

Series/parallel switching confirmation processing in starting of the photovoltaic power generation system 400 according to the fourth embodiment is now described with reference to FIGS. 17, 19 and 20. The series/parallel switching confirmation processing is executed as part of system error checking performed at a starting time when the photovoltaic power generation system 400 is started up by the user. The series/parallel switching confirmation processing is processing of confirming whether or not a parallel/series switching operation of the photovoltaic power generation modules 21 by the switching circuit portions 22 and a switching operation of the connection targets of the generated power output portions 2 normally function as to the respective generated power output portions 2.

Figure 19:
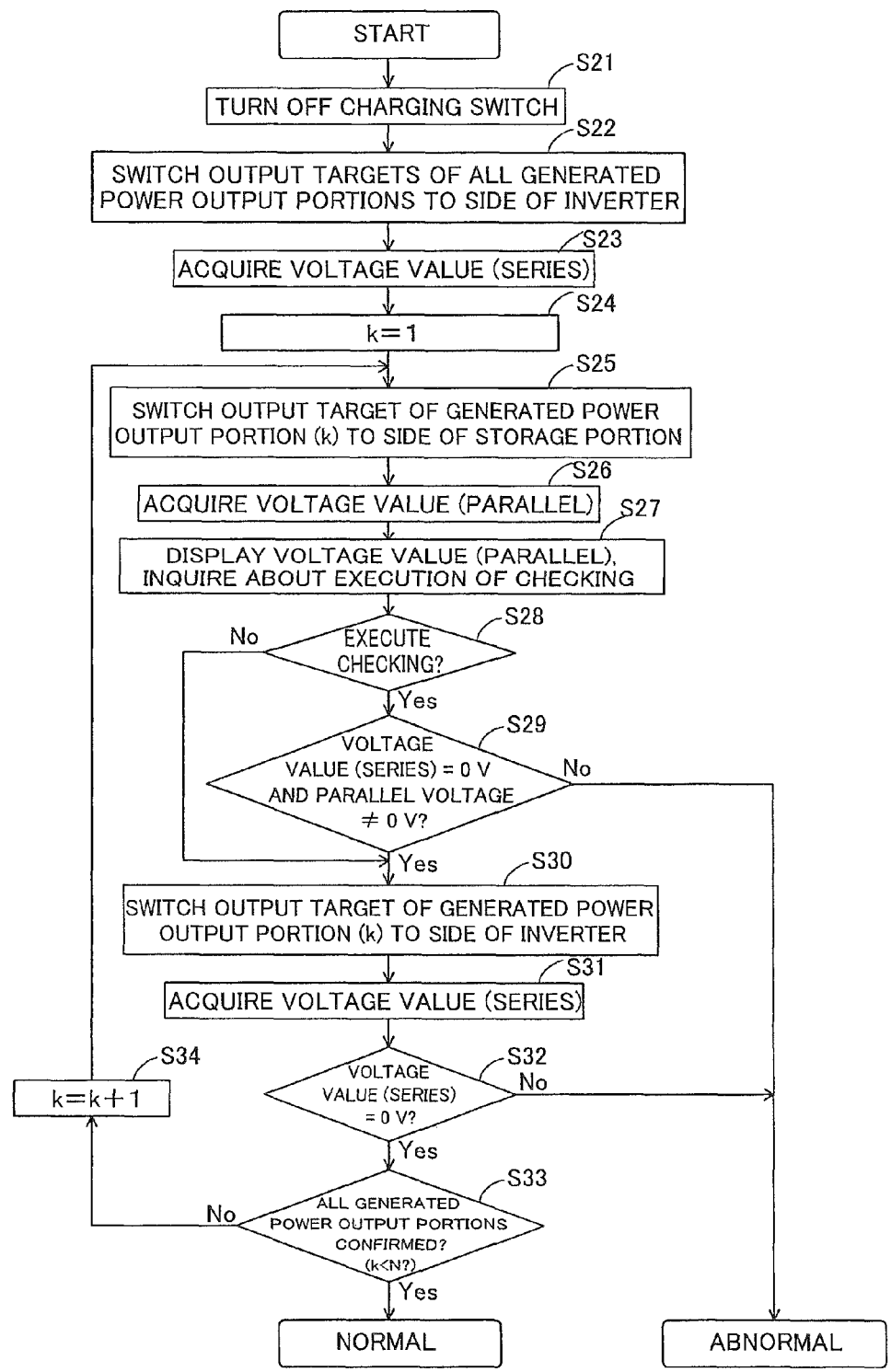
FIG. 19 is a flow chart for illustrating series/parallel switching confirmation processing in starting of the power generation system according to the fourth embodiment of the present invention.

First, the charging switch 404 is turned off by the control portion 401 at a step S21 of FIG. 19. Then, the control portion 401 performs a switching operation of the switching circuit portions 22 at a step S22, whereby the output targets of all (three) generated power output portions 2 are switched to the side of the inverter 4. At this time, the respective photovoltaic power generation modules 21 of the generated power output portions 2 are connected in series with each other. Then, the voltage value (series) of the generated power output portions 2 is acquired by the current•voltage measuring portion 403 at a step S23. The current•voltage measuring portion 403 is provided on the side of the storage portions 3 as shown in FIG. 17, and hence the acquired voltage value is 0 V if the switching of the output targets is normal.

Then, the control portion 401 performs switching operation confirmation of a k-th generated power output portion 2, in order to individually perform switching operation confirmation of each generated power output portion 2. At a step S24, therefore, the value of k is set to "1" by the control portion 401 in order to perform switching operation confirmation of the first generated power output portion 2. Then, the control portion 401 performs a switching operation of the switching circuit portions 22 at a step S25, whereby the output target of the k-th generated power output portion 2 is switched to the side of the storage portions 3. At this time, the respective photovoltaic power generation modules 21 of the switched generated power output portion 2 are connected in parallel with each other.

Then, the voltage value of the generated power output portions 2 is acquired by the current•voltage measuring portion 403 at a step S26. While the charging switch 404 remains off, the current•voltage measuring portion 403 is provided on the side closer to the generated power output portions 3 than the charging switch 404 as shown in FIG. 17, and hence the acquired voltage value equals open end voltage of the generated power output portions 2 if the switching of the output target is normal.

At a step S27, the voltage value acquired at the step S26 is displayed on the display portion 411 by the control portion 401, and an inquiry as to whether or not to execute checking is made to the user. More specifically, a message "PV VOLTAGE*V) ("*" denotes the voltage value), a cursor (">mark") and options of "SKIP?" and "CHECK?" are displayed on the display portion 411, as shown in FIG. 20. The user selects whether to execute checking or to skip checking by pressing keys of the operating portion 412.

At a step S28, whether or not to execute checking is determined by the control portion 401. In other words, whether or not an instruction for executing checking has been input by the user through the operating portion 412. As a result of this, the control portion 401 advances to a step S29 in a case where "CHECK" has been selected by the user, and checking of the k-th generated power output portion 2 whose output target has been switched to the side of the storage portions 3 is executed.

At the step S29, whether or not the voltage (series) acquired at the step S23 is 0 V and the voltage (parallel) acquired at the step S26 exists (is nonzero) is determined by the control portion 401. The voltage (series) acquired at the step S23 is the voltage at the time of switching the output targets of all generated power output portions 2 to the side of the inverter 4 as described above, and hence the voltage value becomes zero if the switching of the output targets is normal. On the other hand, the voltage (parallel) acquired at the step S26 is voltage having been detected after switching the k-th generated power output portion 2 to the side of the storage portions 3. If the operation of switching the k-th generated power output portion 2 to the side of the storage portions 3 has been normally performed, therefore, the voltage value equals the open end voltage of the k-th generated power output portion 2. Thus, whether or not the operation of switching the output target of the k-th generated power output portion 2 from the side of the inverter 4 to the side of the storage portions 3 is normal is determined. In a case where the voltage (series) is not 0 V or a case where the voltage (parallel) equals zero at this step S29, there is a possibility that the switching operation has not been normally performed, and hence the system is determined as abnormal and the processing is terminated (shifts to error processing in abnormality detection). In a case where the voltage (series) is 0 V and the voltage (parallel) is not 0 V, it is confirmed that the switching has been normally executed, and the control portion 401 advances to a step S30.

Figure 20:
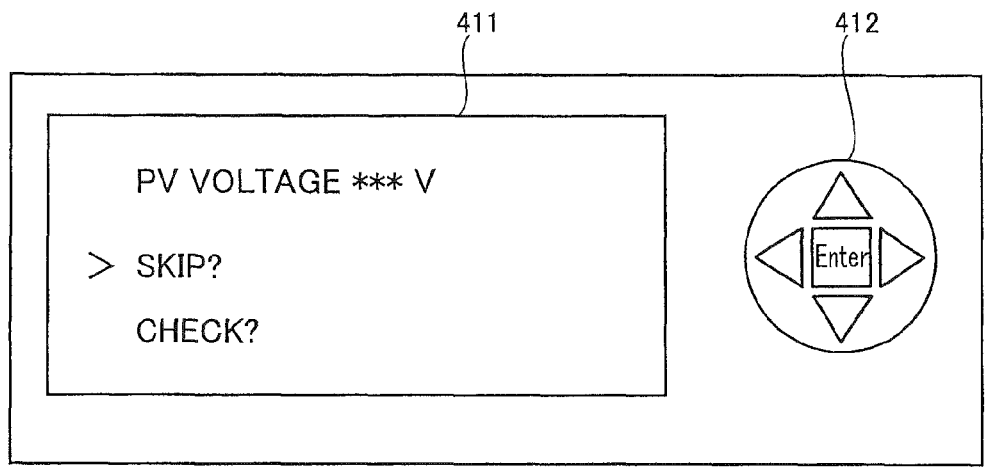
FIG. 20 is an example of display on a display portion in the series/parallel switching confirmation processing of FIG. 19.

In a case where "SKIP" has been instructed by the user as shown in FIG. 20, the control portion 401 advances from the step S28 to the step S30 without through the step S29. In a case where the photovoltaic power generation system 400 is started at night or the like, for example, the respective photovoltaic power generation modules 21 cannot generate power, and hence the voltage of the generated power output portions 2 is not detected. In this case, the voltage (parallel) is 0 V, and hence it follows that the system is determined as abnormal at the step S29. Therefore, the control portion 401 displays the voltage value detected at the step S27 and inquires of the user whether or not to execute checking, whereby the user may skip the series/parallel switching confirmation processing by operating the operating portion 412 in a case of having started the photovoltaic power generation system 400 at night and confirmed that the display of the voltage value displayed on the display portion 411 is 0 V.

At the step S30, the output target of the k-th generated power output portion 2 is switched to the side of the inverter 4. As a result of this, it follows that the output targets of all generated power output portions 2 are returned to the state switched to the side of the inverter 4. At a step S31, the voltage value (series) is acquired by the current•voltage measuring portion 403.

Then, whether or not the voltage value (series) acquired at the step S31 is 0 V is determined by the control portion 401 at a step S32. As described above, the voltage value (series) detected by the current•voltage measuring portion 403 is 0 V in the state where the output targets of all generated power output portions 2 are switched to the side of the inverter 4. If the operation of switching the k-th generated power output portion 2 from the side of the storage portions 3 to the side of the inerter 4 has been normally performed, therefore, the voltage value is 0 V. In a case where the voltage value (series) is not 0 V, there is a possibility that the switching operation has not been normally performed, and hence the system is determined as abnormal (the control portion 401 shifts the error processing in abnormality detection). In a case where the voltage (series) is 0 V, it is confirmed that the switching has been normally executed, and the control portion 401 advances to a step S33. At this step S32, the system is not determined as abnormal also in the case where the photovoltaic power generation system 400 is started at night (the case where the voltage of the generated power output portions 2 is 0 V), and hence it is not necessary to skip the step S32 on the basis of an operation instruction of the user dissimilarly to the aforementioned step S29.

As to the k-th generated power output portion 2, as described above, the operation of switching the output target from the side of the inverter 4 to the side of the storage portions 3 is checked at the step S29, and the operation of switching the output target from the side of the storage portions 3 to the side of the inverter 4 is checked at the step S32. Thereafter whether or not checking of switching operations has been performed as to all (N) generated power output portions 2 is determined by the control portion 401 at the step S33. In a case where an unchecked generated power output portion 2 is present (a case of k<N), the control portion 401 advances to a step S34, and "1" is added to k (k=k+1). Then, the control portion 401 returns to the step S25, and switching operation checking as to the subsequent generated power output portion 2 (k+1-th) is executed. In a case where checking of the final generated power output portion 2 is completed (a case of k=N) without being determined as abnormal, the system is determined as normal at the step S33, and the series/parallel switching confirmation processing is terminated.

According to the fourth embodiment, as hereinabove described, the control portion 401 is formed to be capable of performing the switching operation confirmation processing of the connection state by the switching circuit portions 22 on the basis of the voltage detected by the current•voltage measuring portion 403. The control portion 401 is so formed in this manner that the system can be operated after confirming that switching of the output targets of the generated power output portions 2 and switching of series connection and parallel connection are normally performed. As a result of this, reliability of the photovoltaic power generation system 400 capable of switching charging to the storage portions 3 and power supply to the side of the inverter 4 (the power grid 50 and the general load 60) can be improved.

The remaining effects of the fourth embodiment are similar to those of the aforementioned third embodiment.

Modifications of Fourth Embodiment

Figure 21:
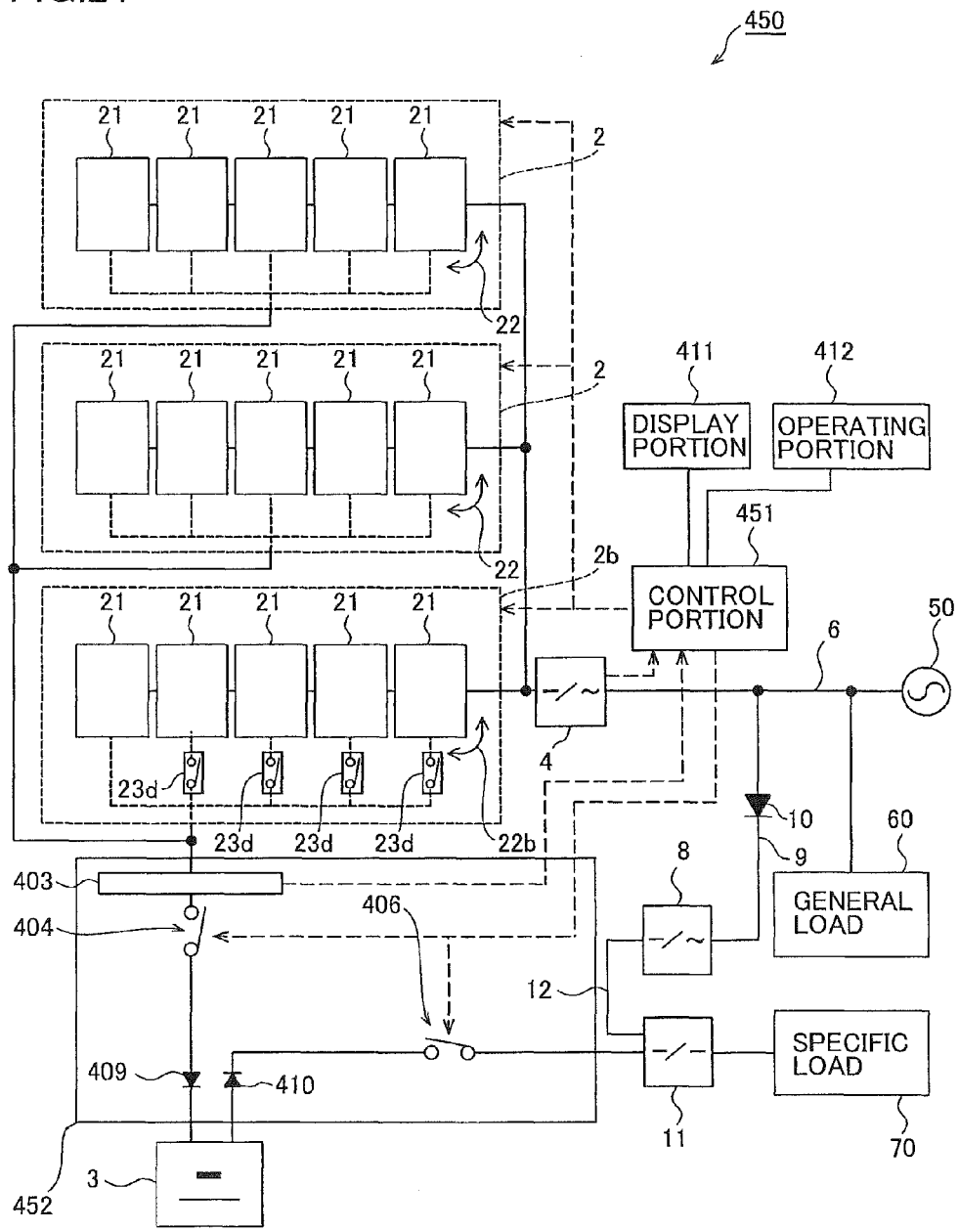
FIG. 21 is a block diagram showing the structure of a power generation system according to a first modification of the fourth embodiment of the present invention.

While the example of so forming the system as to collectively perform switching of the connection targets of the three generated power output portions 3 with respect to the five photovoltaic power generation modules 21 included in each generated power output portion 2 has been shown in the aforementioned fourth embodiment, a system may be so formed as to switch connection and cutoff of respective ones of five photovoltaic power generation modules 21 and a storage portion 3 by employing a generated power output portion 2b (see FIG. 6) as in a first modification of the fourth embodiment shown in FIG. 21. In this first modification of the fourth embodiment, switches 23d are provided on four photovoltaic power generation modules 21 of the generated power output portion 2b.

In a photovoltaic power generation system 450 according to this first modification of the fourth embodiment, two generated power output portions 2 and one generated power output portion 2b having the switches 23d are provided. Thus, it is possible to individually switch output targets of power generated in three generated power output portions 2 (generated power output portion 2b) in total with a control portion 451 on the basis of a measurement result of a current•voltage measuring portion 403, as having been shown in the aforementioned fourth embodiment. According to this first modification of the fourth embodiment, further, the control portion 451 is formed to be capable of individually switching connection between respective ones of five photovoltaic power generation modules 21 of the generated power output portion 2b and the storage portion 3 by performing switching control of the switches 23d. Thus, it is possible to perform power supply from an arbitrary number of two to five photovoltaic power generation modules 21 connected in parallel with each other to the storage portion 3, and it is possible to perform power supply from one photovoltaic power generation module 21 to the storage portion 3. The control portion 451 is an example of the "control apparatus" in the present invention.

Further, the photovoltaic power generation system 450 is provided with only one storage portion 3. Therefore, a charging/discharging switch portion 452 of the photovoltaic power generation system 450 is not provided with charging-side branch paths 407, current measuring portions 405 and discharging-side branch paths 408 etc.

In the photovoltaic power generation system 450 according to the first modification of the fourth embodiment, it is possible to further finely adjust power supplied to the side of the storage portion 3 by switching the number of the photovoltaic power generation modules 21 connected to the storage portion 3 also in a case where the value of current flowing to the storage portion 3 when switching an output target of one generated power output portion 2b to the side of the storage portion 3 exceeds rated current of the storage portion 3, for example. Particularly in the case where only one storage portion 3 is set, high current easily flows to the storage portion 3 as compared with the aforementioned fourth embodiment in which the three storage portions 3 are connected in parallel with each other, and hence it is effective. Also as to this switching of the photovoltaic power generation modules 21 (increase/decrease of the number of connection), it is possible to apply processing similar to the switching processing shown in FIG. 18.

Figure 22:
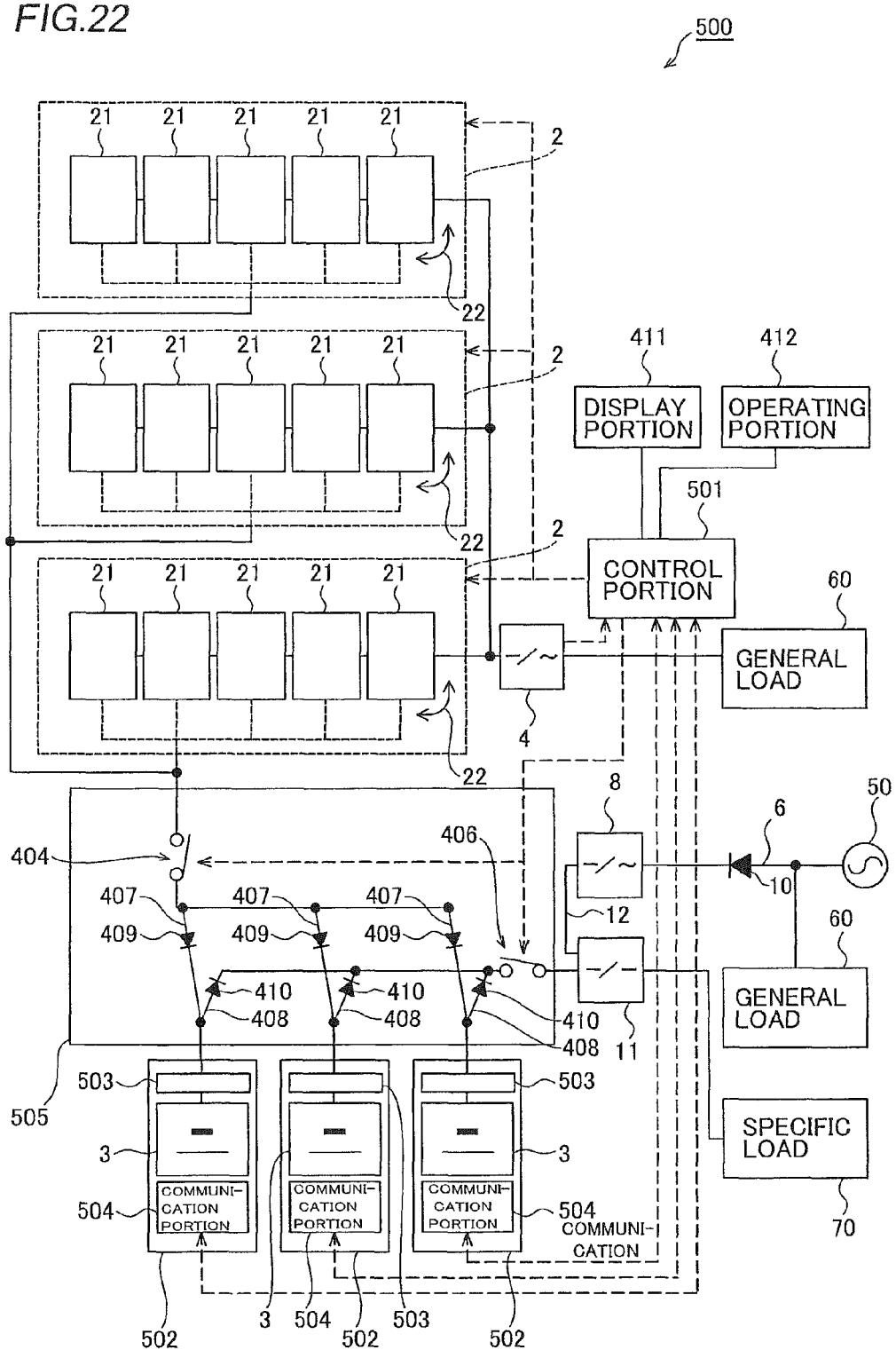
FIG. 22 is a block diagram showing the structure of a power generation system according to a second modification of the fourth embodiment of the present invention.

While the example of providing the current•voltage measuring portion 403 and the three current measuring portions 405 has been shown in the aforementioned fourth embodiment, storage units 502 including current measuring portions 503 may be employed, as in a second modification of the fourth embodiment shown in FIG. 22.

A photovoltaic power generation system 500 according to this second modification of the fourth embodiment is provided with three storage units 502 connected in parallel with a charging/discharging switch portion 505. The respective storage units 502 include storage portions 3, the current measuring portions 503 and communication portions 504 respectively. The current measuring portions 503 are formed to be capable of measuring the value of current flowing to the storage portions 3. The communication portions 504 are formed to be capable of mutually communicating with a control portion 501 of the photovoltaic power generation system 500. Thus, the control portion 501 is capable of acquiring various types of information related to the storage units 502 such as the measurement result (current value) of the current measuring portions 503 and residual capacities of the storage portions 3 through communication with the communication portions 504.

In this second modification of the fourth embodiment, the control portion 501 is capable of acquiring the value of the current flowing to the storage portions 3 through the communication portions 504, whereby it is not necessary to provide a current•voltage measuring portion 403 and current measuring portions 405 on a charging/discharging switch portion 402. Therefore, the structure of the charging/discharging switch portion 505 can be simplified by employing the storage units 502 storing the current measuring portions 503 and the communication portions 504.

In this second modification of the fourth embodiment, an inverter 4 and a power grid 50 are not connected with each other, but the inverter 4 is connected only with a general load 70. Therefore, this photovoltaic power generation system 500 is so formed as not to make power generated by generated power output portions 2 to reversely flow to the side of the power grid 50 so that the power generated by the generated power output portions 2 is supplied to only the general load 60. Thus, the power generated by the generated power output portions 2 may not be made to reversely flow to the side of the power grid 50, but the power generated by the generated power output portions 2 may be supplied only to equipment (general load 60) in facilities.

Fifth Embodiment

Switching control of generated power output portions 2 of a power generation system (photovoltaic power generation system) according to a fifth embodiment of the present invention is now described with reference to FIGS. 17, 21, 22 and 23. In this fifth embodiment, an example so formed as to calculate a predicted current value predicted in a case of switching the generated power output portions 2 to the side of a storage portion 3 and as to perform switching control of the generated power output portions 2 on the basis of this predicted current value in addition to the aforementioned fourth embodiment so formed as to perform connection switching control of the generated power output portions 2 and the storage portion 3 on the basis of whether or not the measured current value exceeds the rated current of the storage portion 3 is described.

Connection switching processing of the generated power output portions 2 in charging of the storage portion 3 of the photovoltaic power generation system according to the fifth embodiment is now described. The structure of any of the fourth embodiment (see FIG. 17), the first modification (see FIG. 21) of the fourth embodiment and the second modification (see FIG. 22) may be employed as an apparatus structure of the photovoltaic power generation system, and hence an example of applying the connection switching processing of the photovoltaic power generation system according to the fifth embodiment to the photovoltaic power generation system 400 shown in FIG. 17 is shown here.

Figure 23:
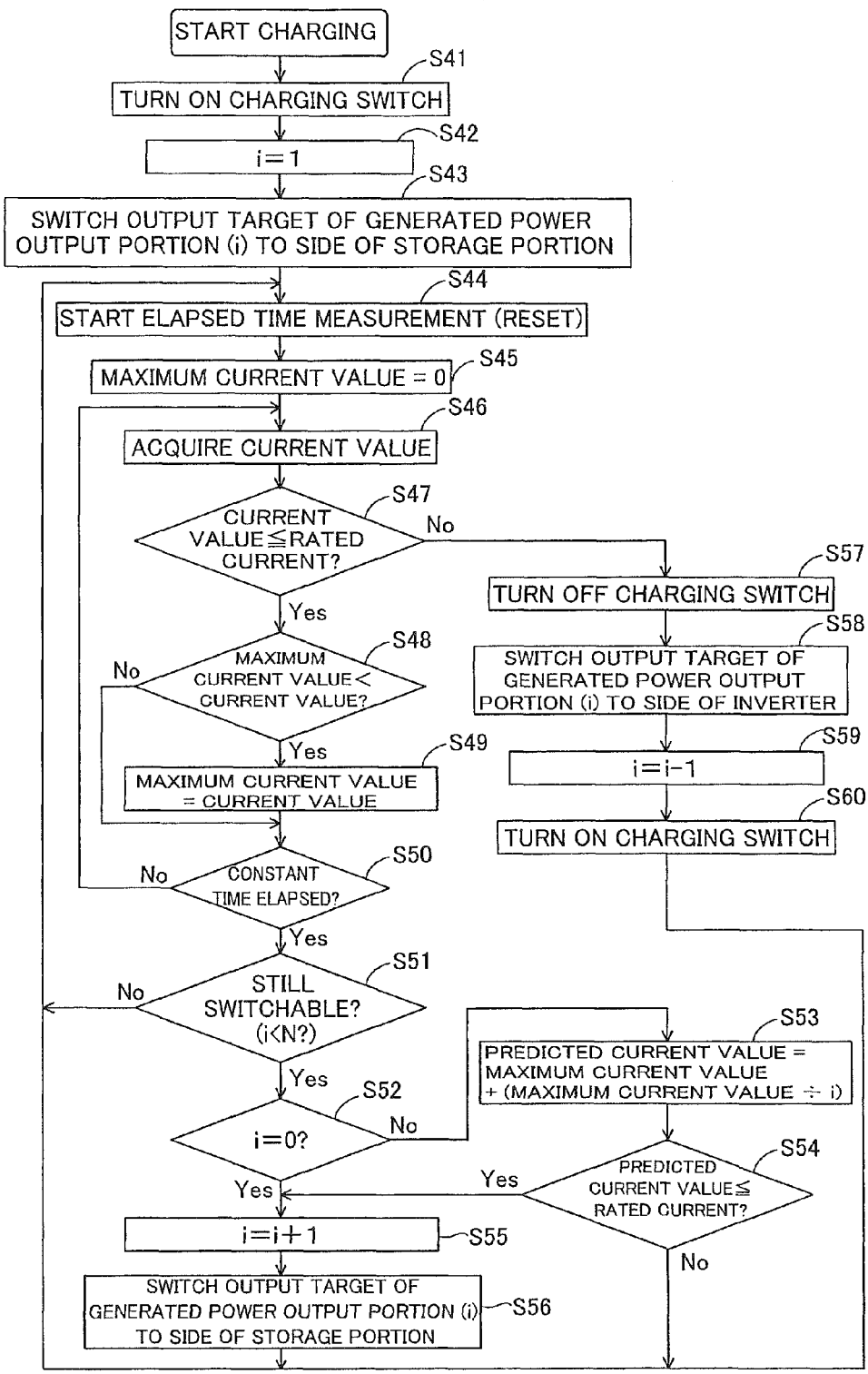
FIG. 23 is a flow chart for illustrating connection switching processing of a generated power output portion of a power generation system according to a fifth embodiment of the present invention.

First, a charging switch 404 is turned on (closed) at a step S41 of FIG. 23. Thus, charging can be started when switching connection targets of the generated power output portions 2 to the side of the storage portion 3.

At a step S42, a control portion 401 sets the number i of the generated power output portions 2 connected to the side of the storage portion 3 to "1". At a step S43, the connection target of the first (i=1) generated power output portion 2 is switched to the side of the storage portion 3 by the control portion 401. As a result of this, power is supplied from the connected generated power output portion 2 to the side of the storage portion 3 and charging is started. At this time, the value of current flowing to the storage portion 3 is measured in a current•voltage measuring portion 403 and respective current measuring portions 405. Then, measurement of an elapsed time is started by the control portion 401 at a step S44.

At a step S45, a maximum current value for calculation of the predicted current value is set to "0" by the control portion 401. Then, the current value measured by the current•voltage measuring portion 403 or the respective current measuring portions 405 is acquired by the control portion 401 at a step S46.

At a step S47, whether or not the acquired current value is not more than a rated current value of the storage portion 3 is determined by the control portion 401. The control portion 401 advances to a step S48 in a case where the acquired current value is not more than the rated current value, and shifts to a step S57 in a case where the acquired current value exceeds the rated current value. In a case of acquiring the current value from the respective current measuring portions 405, the control portion 401 advances to the step S48 in a case where all of current values acquired in the respective current measuring portions 405 are not more than the rated current value of the storage portion 3, and advances to the step S57 if there is at least one exceeding value.

Processing from the step S57 to a step S60 is the same processing as the steps S11 to S14 of the aforementioned fourth embodiment, and hence description is omitted.

At the step S48, whether or not the acquired current value is larger than the maximum current value is determined by the control portion 401. In a case where the acquired current value is larger than the maximum current value, the control portion 401 advances to a step S49, and sets the current value as the maximum current value. In a case where the acquired current value is not more than the maximum current value, the control portion 401 advances to a step S50 without setting the current value.

At the step S50, whether or not a constant time (two minutes, for example) has elapsed after starting elapsed time measurement at the step S24 is determined. In a case where the constant time has not elapsed, the control portion 401 returns to the step S46. When the constant time elapses, the control portion 401 advances to a step S51. Therefore, the control portion 401 loops between the steps S46 to S50 for the constant time, thereby confirming that the current value does not exceed the rated current continuously for this constant time, while the maximum value (maximum current value) of the current value acquired in the constant time is set. In the case where the current value exceeding the rated current of the storage portion 3 is detected as described above, the control portion 401 shifts to the steps S57 to S60, and hence the maximum current value is not set. In other words, the maximum current value equals the maximum current value acquired by the current•voltage measuring portion 403 or the respective current measuring portions 405 in the case not exceeding the rated current.

In a case where the acquired current value has not exceeded the rated current of the storage portion 3 up to a lapse of the constant time, whether or not the generated power output portions 2 can be switched to the side of the storage portion 3 (i<N?) is determined at the step S51. In a case where the number i of the generated power output portions 2 connected to the side of the storage portion 3 coincides with N, more generated power output portions 2 cannot be switched to the side of the storage portion 3, and hence the control portion 401 returns to the step S44.

In a case where the number i of the generated power output portions 2 connected to the side of the storage portion 3 is smaller than N (a case where the generated power output portions 2 are still switchable), the control portion 401 advances to a step S52, and whether or not all generated power output portions 2 are connected to the side of the inverter 4 (i=0?) is determined. In a case where there are generated power output portions 2 connected to the side of the storage portion 3, the control portion 401 advances to a step S53, and calculation of the predicted current value based on the maximum current value measured by the current•voltage measuring portion 403 or the respective current measuring portions 405 is performed.

At this step S53, the predicted current value=the maximum current value+(maximum current value÷i) is calculated by the control portion 401. In other words, assuming that output power of each generated power output portion 2 is identical, it is predicted that the current value increases by (current value÷2) (current value becomes (1+1/i=3/2) times) when connecting the third generated power output portion 2 to the side of the storage portion 3 in a case where two generated power output portions 2 are connected to the side of the storage portion 3 (i=2), for example. Whether or not the current value exceeds the rated current of the storage portion 3 in a case of connecting the subsequent generated power output portion 2 to the side of the storage portion 3 is to be determined here, and hence the maximum current value measured in a prescribed time is employed for calculation of the predicted current value. Thus, it is predicted that value of a current about the predicted current value flows to the storage portion 3 at a maximum in the case of connecting the subsequent generated power output portion 2 to the side of the storage portion 3.

When the predicted current value is calculated, the control portion 401 advances to a step S54, and whether or not the calculated predicted current value is not more than the rated current of the storage portion 3 is determined by the control portion 401. In a case where the predicted current value exceeds the rated current, there is a high possibility that the current value exceeds the rated current in the case of connecting the subsequent generated power output portion 2 to the side of the storage portion 3, and hence the control portion 401 returns to the step S44 without switching the generated power output portions 2 to the side of the storage portion 3.

When the predicted current value is determined as not more than the rated current at the step S54, on the other hand, the control portion 401 advances to a step S55 and adds "1" to the number i of the generated power output portions 2 connected to the side of the storage portion 3, so that the i-th generated power output portion 2 added at the step S56 is switched to the side of the storage portion 3. In a case where all generated power output portions 3 have been determined as connected to the side of the inverter 4 (i=0) at the step S52, it follows that no current flows to the side of the storage portion 3, and hence the control portion 401 advances to the steps S55 and S56 without performing calculation of the predicted current value (the first generated power output portion 2 is switched to the side of the storage portion 3).

Thereafter the control portion 401 returns to the step S44, the elapsed time measurement is reset, and time measurement is started again. The maximum current value is also reset (set to "0") at the step S45.

The aforementioned processing is continuously executed, whereby the connection switching processing of the generated power output portions 2 in charging of the storage portion 3 of the photovoltaic power generation system according to the fifth embodiment is executed.

According to the fifth embodiment, as hereinabove described, the control portion 401 calculates the predicted value of the current flowing to the storage portion 3 in a case of switching the connection targets of the generated power output portions 2 to the side of the storage portion 3 on the basis of the measurement result of the current•voltage measuring portion 403 or the respective current measuring portions 405 and determines whether or not to switch the generated power output portions 2 to the side of the storage portion 3 on the basis of the predicted current value. The control portion 401 is so formed in this manner that switching of the connection targets may not be performed in a case where it is predictable in advance that the current value exceeds the rated current of the storage portion 3 in the case of switching the connection targets of the generated power output portions 2 to the side of the storage portion 3. Therefore, reliability of the system can be improved by reducing the number of unnecessary switching operations while excess current can be prevented from flowing to the storage portion 3 in advance in a case where (it is predicted that) the current value exceeds the rated current of the storage portion 3, whereby life prolongation of the storage portion 3 can be attained.

The remaining effects of the fifth embodiment are similar to those of the aforementioned fourth embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are included.

For example, while the example of generating power with the photovoltaic power generation modules 21 has been described in each of the aforementioned first to third embodiments and the modifications thereof, the present invention is not restricted to this, but power generation modules such as other direct current generators or wind turbine generators generating power with another renewable energy may be employed as power generation modules.

While the example of employing the secondary cell such as a lithium ion storage cell, a nickel-hydrogen storage cell or the like as the storage portion 3 has been described in each of the aforementioned first to third embodiments and the modifications thereof, the present invention is not restricted to this, but another secondary cell may be employed. Further, a capacitor may be employed in place of the storage cell as an example of the "storage portion" in the present invention.

While such an example that the voltage of the storage portion 3 is 48 V has been described in each of the aforementioned first to third embodiments and the modifications thereof, the present invention is not restricted to this, but voltage other than 48 V may be employed. While the voltage of the storage portion is desirably not more than about 60 V, proper voltage is selected in consideration of the rated voltage of the specific load 70•power loss in wires or the like.

Figure 24:
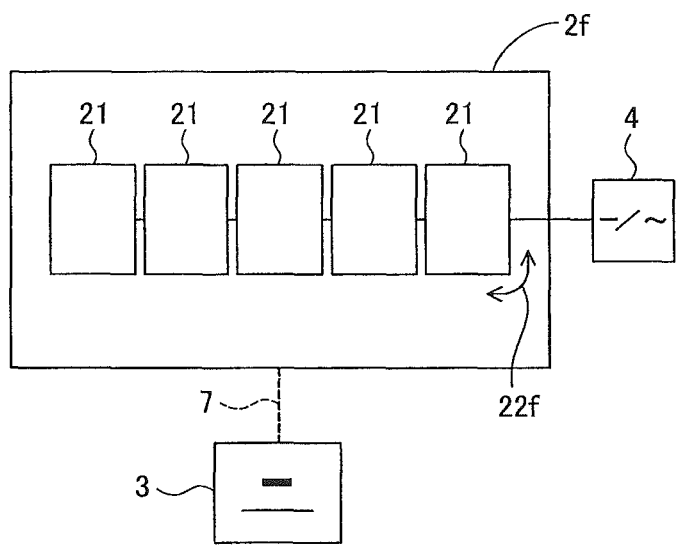
FIG. 24 is a diagram showing a series connection state of a power generation system according to a sixth modification of the first embodiment of the present invention.
Figure 25:
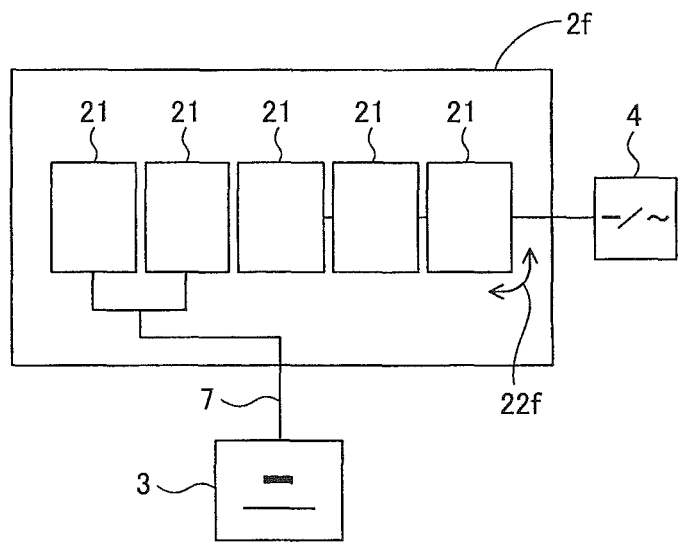
FIG. 25 is a diagram showing a parallel connection state of the power generation system according to the sixth modification of the first embodiment of the present invention.
Figure 26:
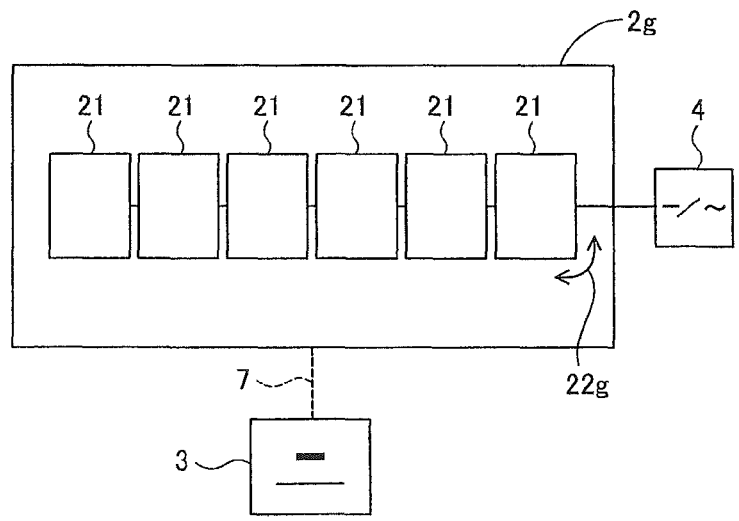
FIG. 26 is a diagram showing a series connection state of a power generation system according to a seventh modification of the first embodiment of the present invention.
Figure 27:
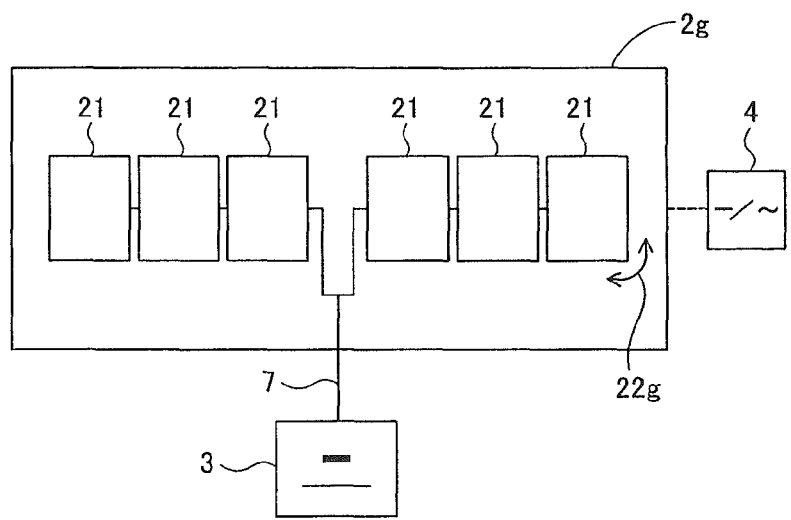
FIG. 27 is a diagram showing a parallel connection state of the power generation system according to the seventh modification of the first embodiment of the present invention.

While the example of connecting all of the five photovoltaic power generation modules 21 in parallel with each other at the time of connecting the generated power output portion 2 to the side of the storage portion 3 has been described in each of the aforementioned first to third embodiments, the present invention is not restricted to this, but the generated power output portion may be connected to the side of the storage portion in a state of connecting only partial photovoltaic power generation modules in parallel with each other among the five. Further, the generated power output portion may be connected to the side of the storage portion 3 in a state of connecting partial photovoltaic power generation modules in parallel with each other, and the generated power output portion may be connected to the side of the inverter 4 in a state of connecting the remaining photovoltaic power generation modules in series with each other. In a generated power output portion 2f of an example shown in FIGS. 24 and 25, for example, a switching circuit portion 22f is so controlled as to connect five photovoltaic power generation modules 21 in series with each other and output power to the side of an inverter 4 in a series connection state and as to connect two photovoltaic power generation modules 21 in parallel with each other and output power to the side of a storage portion 3 in a parallel connection state. In this case, the number of the series-connected photovoltaic power generation modules 21 must be adjusted in an inputtable range of the inverter 4. In a generated power output portion 2g of an example shown in FIGS. 26 and 27, a switching circuit portion 22g is so controlled as to connect six photovoltaic power generation modules 21 in series with each other and output power to the side of an inverter 4 in a series connection state and as to connect two sets each obtained by series-connecting three photovoltaic power generation modules 21 in parallel with each other and output power to the side of a storage portion 3. Thus, it is possible to input power of proper voltage with respect to the value of nominal voltage of the storage portion 3 in the storage portion 3 by varying a connection mode (series connection, parallel connection or combination thereof) of a plurality of photovoltaic power generation modules. A case of employing photovoltaic power generation modules whose nominal maximum output operating voltage is about 60 V and a case where nominal voltage of a storage portion is 96 V is described as an example. In this case, the nominal voltage of a storage portion 3 is desirably selected to be at least 70% and not more than 90% of the nominal maximum output operating voltage as described above, and hence output voltage to the storage portion is desirably about 120 V. Therefore, four photovoltaic power generation modules are employed. Thus, power is output with voltage of about 240 V by connecting four in series with each other in a case of connecting the generated power output portion to the side of an inverter, while the power is output with voltage of about 120 V by connecting two sets of series-connected pairs in parallel with each other in a case of outputting power to the side of the storage portion.

While such an example that an example of the "power converter" is the inverter 4 converting direct current to alternating current has been described in each of the aforementioned first to third embodiments and the modifications thereof, the present invention is not restricted to this, but the same may be a DC-DC converter performing DC-DC conversion (raising or lowering DC voltage) or a cycloconverter performing AC-AC conversion (converting the frequency of alternating current). A case where AC-AC conversion is performed is a case of employing power generation modules generating AC power by wind power generation or the like, for example.

While the example of providing one storage portion 3 has been described in each of the aforementioned first to third embodiments and the modifications thereof, the present invention is not restricted to this, but a plurality of storage portions 3 may be provided. Further, the plurality of storage portions may be connected in series or parallel with each other.

While such an example that the inverter 4 is connected to the power grid 50 has been described in each of the aforementioned first to third embodiments and the modifications thereof, the present invention is not restricted to this, but the same may not be connected to the power grid 50. A reverse power flow preventer for restricting a reverse power flow may be provided in the vicinity of a node between an in-customer wire and the power grid or the like. In this case, the diode 10 can be omitted.

Further, the storage portion 3 may be provided with a control apparatus performing control of suppressing overcharging•overdischarigng or the like. Further, the storage portion 3 may be connected with the generated power output portion 2 or the specific load 70 through such a control apparatus.

A power source for driving switches 23 may be so formed as to supply power for driving the switches 23 of the switching circuit portion 22 from the storage portion 3 and as to switch the switches 23 with the power, or may be so formed as to connect the switches to the series side with power in a case where the power from the power grid 50 is supplied so that the switches are automatically switched to the parallel side in a case where electric service to the power grid 50 is interrupted and no power is supplied to the switching circuit portion 22. According to either structure, it is possible to switch the switches to the parallel side in the interruption of electric service.

As an example of a series-parallel connection method, the switching circuit portion may be so formed as to switch the connection state between such a series connection state that the plurality of power generation modules (photovoltaic power generation modules 21) are at least partially connected in series with each other and the plurality of power generation modules are connected to the inverter and such a parallel connection state that the series-connected power generation modules are at least partially connected in parallel with each other and the parallel-connected power generation modules are connected to the storage portion.

While such an example that examples of the "mechanical switch circuit" are the relay switches including contact switching portions and coils has been described in each of the fourth and fifth modifications of the aforementioned first embodiment, the present invention is not restricted to this. The mechanical switch circuits may be other switches other than the relay switches, so far as the same are switches of such a type that contacts are mechanically switched.

While such an example that examples of the "electronic switch circuit" are the FET switches has been described in each of the fourth and fifth modifications of the aforementioned first embodiment, the present invention is not restricted to this. The electronic switch circuit may be another switch element such as a bipolar transistor other than the FET switch or a switch circuit obtained by combining a plurality of semiconductor elements with each other, so far as the same is a switch electronically switchable in a contactless manner.

While the example of so forming the power generation system as to switch the generated power output portions 2 one by one in the connection switching processing of the generated power output portions 2 has been described in each of the aforementioned fourth and fifth embodiments, the present invention is not restricted to this. According to the present invention, the plurality of generated power output portions may be switched at once. Further, the number of generated power output portions switched at once may be increased as 1, 2, 4, 8 . . . , for example.

While the example of so forming the power generation system as to display the voltage value on the display portion 411 and as to make an inquiry as to whether or not to execute checking to the user for such a case that the voltage value of the generated power output portions 2 cannot be detected at night or the like in the switching operation confirming processing of the connection state by the switching circuit portions 22 in the aforementioned fourth embodiment, the present invention is not restricted to this. For example, an illuminometer may be provided, and the power generation system may be so formed as to determine whether or not it is night (whether or not there is photoirradiation allowing power generation) on the basis of measured illuminance and as to skip checking in a case where power generation is impossible. In this case, there is no need to inquire of the user as to whether or not to execute checking.

What is claimed is:

1. A switching circuit employed for a power generation system including a generated power output portion constituted to include a plurality of power generation modules generating power with renewable energy as well as a power converter and a storage portion supplied with power generated in said power generation modules and capable of switching a connection state between said plurality of power generation modules, for switching:
   a first connection state where at least a part of said plurality of power generation modules are connected in series with each other, and
   a second connection state where at least a part of said plurality of power generation modules are connected in parallel with each other, or, said generated power output portion is connected to said storage portion so that generated power is supplied from one of said power generation modules to said storage portion.

2. The switching circuit according to claim 1, comprising a switch circuit switching the connection state between said plurality of power generation modules, wherein
   said switch circuit is formed to be capable of switching the connection state so that at least a part of said plurality of power generation modules are connected in series or in parallel with each other and to be capable of switching a connection target of said generated power output portion to said power converter or to said storage portion.

3. The switching circuit according to claim 2, wherein said switch circuit includes a first switch circuit switching the connection state between said plurality of power generation modules and a second switch circuit switching said power converter or said storage portion as a connection target of said generated power output portion.

4. The switching circuit according to claim 2, wherein said switch circuit is formed by a mechanical switch circuit, and
the switching circuit further comprises an electronic switch circuit capable of switching inflow and cutoff of current into said mechanical switch circuit, and
is formed to be capable of switching the connection state between said plurality of power generation modules by operating said mechanical switch circuit in a state where the current to said mechanical switch circuit is cut off by said electronic switch circuit.

5. The switching circuit according to claim 1, so formed that:
said generated power output portion is connected to said power converter in said first connection state, and
said generated power output portion is connected to said storage portion so that generated power output by said parallel-connected power generation modules is supplied to said storage portion in said second connection state.

6. The switching circuit according to claim 5, so formed as to connect all of said plurality of power generation modules in series with each other in said first connection state, as to connect a part of said plurality of power generation modules in parallel with each other in said second connection state, and as to connect said parallel-connected power generation modules to said storage portion.

7. The switching circuit according to claim 5, so formed as to connect said parallel-connected power generation modules to said storage portion without through a voltage converter in a case where said parallel-connected power generation modules are connected to said storage portion.

8. The switching circuit according to claim 1, so formed that the connection state between said plurality of power generation modules is switched on the basis of a current of generated power supplied to said storage portion, which is measured by a current measuring portion.

9. The switching circuit according to claim 8, so formed as to connect said generated power output portion and said storage portion with each other through a charging switch circuit capable of switching connection or cutoff of said generated power output portion and said storage portion, and
so formed that said generated power output portion and said storage portion are connected with each other or cut off and said first connection state and said second connection state are switched on the basis of said current of generated power supplied to said storage portion, which is measured by said current measuring portion.

10. A control apparatus employed for a power generation system comprising a generated power output portion constituted to include a plurality of power generation modules generating power with renewable energy and a switching portion switching a connection state between said plurality of power generation modules as well as a power converter and a storage portion supplied with power generated in said power generation modules, so controlling said switching portion as to switch:

a first connection state where at least a part of said plurality of power generation modules are connected in series with each other and said generated power output portion is connected to said power converter, and a second connection state where at least a part of said plurality of power generation modules are connected in parallel with each other or said generated power output portion is connected to said storage portion so that generated power is supplied from one of said power generation modules to said storage portion.

11. The control apparatus according to claim 10, formed to be capable of acquiring a current of generated power supplied to said storage portion, which is measured by a current measuring portion, and
so controlling said switching portion as to switch said generated power output portion to said first connection state in a case where the current value measured by said current measuring portion is larger than a prescribed value.

12. The control apparatus according to claim 11, so controlling said switching portion as to switch said generated power output portion to said second connection state in a case where said current of generated power measured by said current measuring portion is not more than said prescribed value when charging said storage portion.

13. The control apparatus according to claim 11, formed to be capable of switch-controlling a charging switch circuit provided between said generated power output portion and said storage portion and capable of switching connection and cutoff of said generated power output portion and said storage portion, and
so controlling said switching portion as to connect said generated power output portion and said storage portion with each other by said charging switch circuit and as to switch said generated power output portion to said second connection state in a case where said current of generated power measured by said current measuring portion is not more than a prescribed value, and
as to cut off said generated power output portion and said storage portion by said charging switch circuit and as to switch said generated power output portion to said first connection state in a case where said current of generated power measured by said current measuring portion is larger than said prescribed value.

14. The control apparatus according to claim 11, wherein said power generation system further includes a plurality of said generated power output portions,
said plurality of generated power output portions are so formed that the switching between said first connection state and said second connection state is switchable every said generated power output portion, and
the control apparatus controls the number of said generated power output portions connected to said storage portion by switching said generated power output portions to said second connection state on the basis of said current of generated power measured by said current measuring portion.

15. The control apparatus according to claim 11, so controlling said switching portion as to calculate a predicted value of current flowing to said storage portion in a case of switching said generated power output portion to said second connection state on the basis of said current of generated power measured by said current measuring portion and as to switch said generated power output portion to said second connection state on the basis of said predicted current value.

16. The control apparatus according to claim 10, formed to be capable of acquiring a voltage detected by a voltage detection portion detecting voltage of said generated power output portion, and determining a switching situation of the connection state by said switching portion on the basis of the voltage detected by said voltage detection portion.

17. A power generation system comprising:

a first generated power output portion constituted to include a plurality of power generation modules generating power with renewable energy and a switching portion switching a connection state between said plurality of power generation modules; and a power converter and a storage portion supplied with power generated in said power generation modules, wherein said switching portion is formed to be capable of switching:

a first connection state where at least a part of said plurality of power generation modules are connected in series with each other and said first generated power output portion is connected to said power converter, and a second connection state where at least a part of said plurality of power generation modules are connected in parallel with each other, or, said generated power output portion is connected to said storage portion so that generated power is supplied from one of said power generation modules to said storage portion.

18. The power generation system according to claim 17, further comprising:

a plurality of said first generated power output portions, and a control portion controlling switching of the connection state between said plurality of power generation modules by said switching portion, wherein each of said plurality of first generated power output portions is so formed that the connection state between said plurality of power generation modules in each said first generated power output portion is individually switchable, and the power generation system is so formed that the connection state between said plurality of power generation modules is controlled by said control portion.

19. The power generation system according to claim 17, further comprising a second generated power output portion constituted to include said plurality of power generation modules connected in series with each other, and so formed that:

said second generated power output portion is connected to said power converter, and said first generated power output portion and said second generated power output portion are connected in parallel with each other when taking the first connection state where said first generated power output portion is connected to said power converter.

20. The power generation system according to claim 17, wherein said switching portion includes a switch circuit switching the connection state between said plurality of power generation modules, and said switch circuit is formed to be capable of switching the connection state so that at least a part of said plurality of power generation modules are connected in series or in parallel with each other and to be capable of switching a connection target of said generated power output portion to said power converter or to said storage portion in association with the switching of said connection state.

21. The power generation circuit according to claim 17, so formed as to take said first connection state so that power generated by said power generation modules is supplied to said power converter in normal operation, and as to take said second connection state so that power generated by said power generation modules is supplied to said storage portion in unnormal operation.

22. The power generation system according to claim 17, wherein a load is connected to said storage portion, and the power generation system is so formed that power stored in said storage portion is supplied to said load in said first connection state, and power generated by said parallel-connected power generation modules and power stored in said storage portion are supplied to said load in said second connection state.

23. The power generation system according to claim 17, wherein said power generation modules are photovoltaic power generation modules, said power converter is an inverter, said photovoltaic power generation modules are connected to a power grid through said inverter, a load is connected to said storage portion, and the power generation system is formed to be switched to said second switching state so that power generated by said parallel-connected power generation modules and power stored in said storage portion are supplied to said load in a case where there is a possibility that power stored in said storage portion is not enough to supply for said load, and to be switched to said first connection state so that power generated by said photovoltaic power generation modules is reversely flowable into said power grid through said inverter while power stored in said storage portion is supplied to said load in a case where power supplied to said load can be covered with power stored in said storage portion.

* * * * *